(12) United States Patent
Rauker et al.

(10) Patent No.: US 9,035,406 B2
(45) Date of Patent: May 19, 2015

(54) WAFER LEVEL OPTICAL PACKAGING SYSTEM, AND ASSOCIATED METHOD OF ALIGNING OPTICAL WAFERS

(75) Inventors: Goran M. Rauker, Longmont, CO (US); George C. Barnes, IV, Westminster, CO (US)

(73) Assignee: OmniVision Technologies, Inc., Santa Clara, CA (US)

( * ) Notice: Subject to any disclaimer, the term of this patent is extended or adjusted under 35 U.S.C. 154(b) by 1031 days.

(21) Appl. No.: 13/113,857

(22) Filed: May 23, 2011

(65) Prior Publication Data

US 2012/0299138 A1      Nov. 29, 2012

(51) Int. Cl.
*H01L 31/0232* (2014.01)
*G02B 7/00* (2006.01)
*G02B 3/00* (2006.01)
*H01L 27/146* (2006.01)

(52) U.S. Cl.
CPC ........... *G02B 7/004* (2013.01); *H01L 27/14625* (2013.01); *G02B 3/0068* (2013.01); *G02B 3/0075* (2013.01)

(58) Field of Classification Search
USPC ................. 257/431–434, E33.121, E33.122, 257/E33.127; 359/558, 570, 574, 576
See application file for complete search history.

(56) References Cited

U.S. PATENT DOCUMENTS

| | | | |
|---|---|---|---|
| 4,923,301 A | 5/1990 | White | |
| 5,801,390 A | 9/1998 | Shiraishi | |
| 6,271,966 B1 * | 8/2001 | Tanabe et al. | 359/566 |
| 6,483,572 B2 | 11/2002 | Simpson et al. | |
| 7,109,508 B2 | 9/2006 | Shiraishi | |
| 7,298,941 B2 * | 11/2007 | Palen et al. | 385/33 |
| 7,329,861 B2 | 2/2008 | Ma et al. | |
| 7,592,680 B2 | 9/2009 | Lee et al. | |
| 7,796,337 B2 | 9/2010 | Chang et al. | |
| 7,989,250 B2 * | 8/2011 | Nesnidal | 438/56 |
| 8,625,942 B2 * | 1/2014 | Na et al. | 385/37 |
| 2006/0249859 A1 | 11/2006 | Eiles et al. | |
| 2010/0284089 A1 | 11/2010 | Shyu et al. | |

FOREIGN PATENT DOCUMENTS

WO    WO2008020899    2/2008

* cited by examiner

*Primary Examiner* — Matthew E Warren

(74) *Attorney, Agent, or Firm* — Lathrop & Gage LLP

(57) ABSTRACT

An optical system has a first relief-type diffraction grating fiducial, or alignment mark, on a transparent surface of a first optical wafer or plate, the grating arranged to deflect light away from an optical path and appear black. The first wafer may have lenses. The first fiducial is aligned to another fiducial on a second wafer having further optical devices as part of system assembly; or the fiducials are aligned to alignment marks or fiducials on an underlying photosensor. Once the optical devices are aligned and the wafers bonded, they are diced to provide aligned optical structures for a completed camera system. Alternatively, an optical wafer is made by aligning a second relief-type diffraction grating fiducial on a first master to a first relief-type diffraction grating fiducial on an optical wafer preform, pressing the first master into a blob to form optical shapes and adhere the blob to the optical wafer preform.

8 Claims, 22 Drawing Sheets

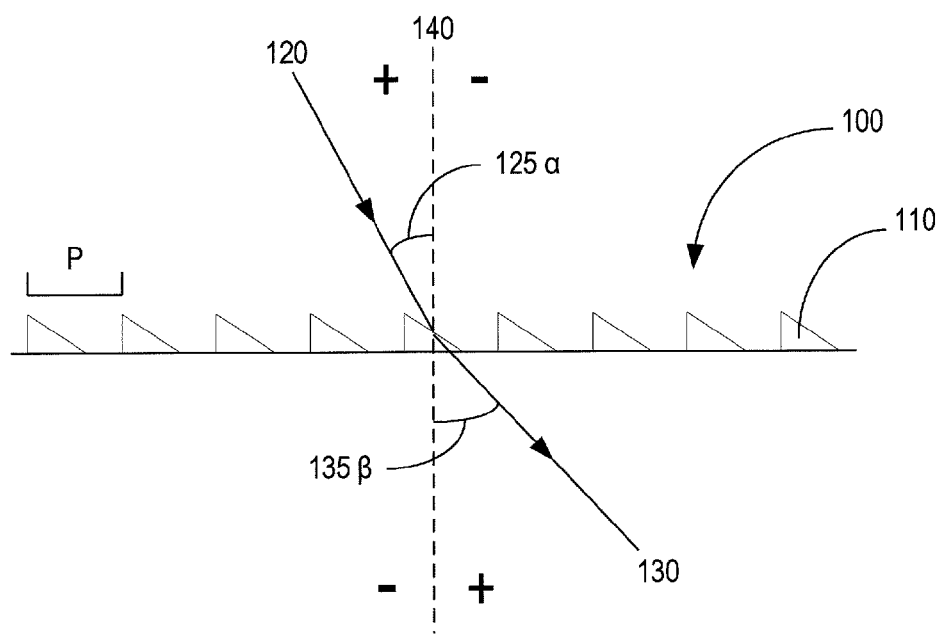
FIG. 1A  *PRIOR ART*
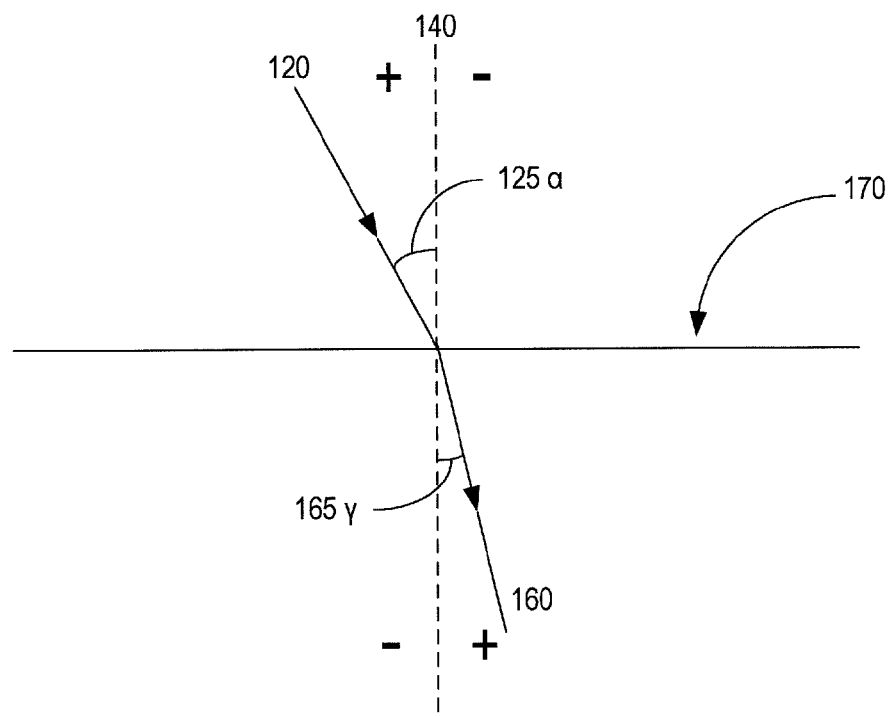
FIG. 1B  *PRIOR ART*

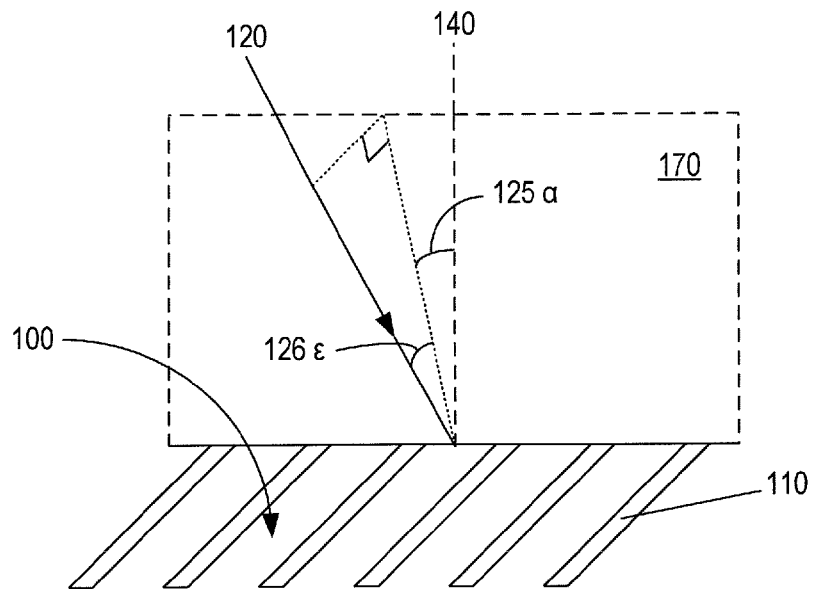
FIG. 2  *PRIOR ART*
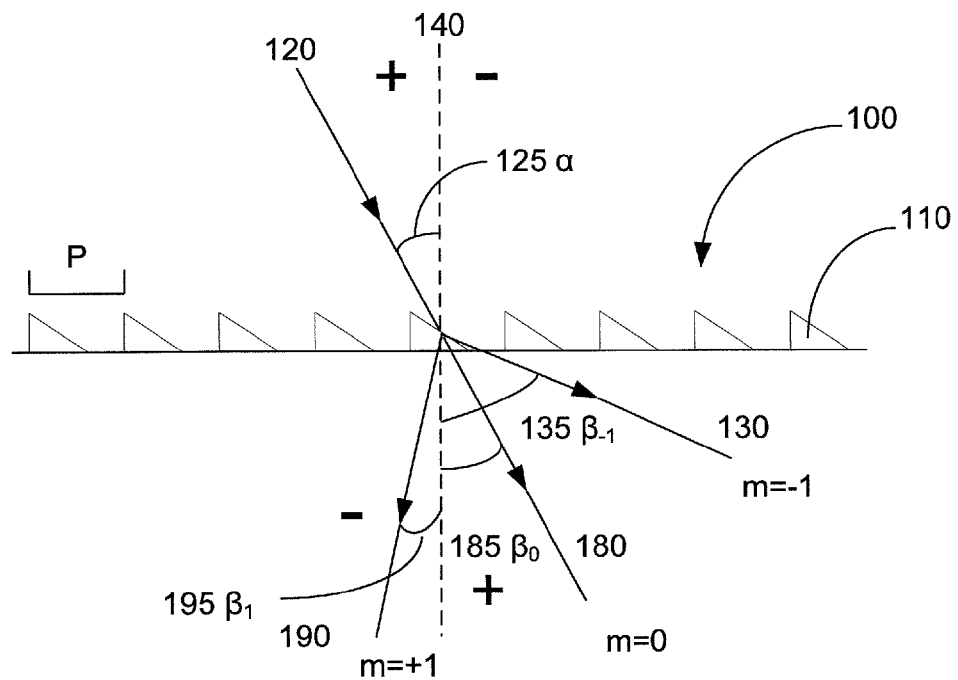
FIG. 3
*PRIOR ART*

WAFER LEVEL OPTICAL PACKAGING SYSTEM, AND ASSOCIATED METHOD OF ALIGNING OPTICAL WAFERS

TECHNICAL FIELD

This disclosure relates generally to fiducials for aligning optical wafers or plates, and in particular but not exclusively, relates to fiducials that include one or several diffraction gratings.

BACKGROUND

A diffraction grating is an optical device with periodic structures such as grooves, the stuctures having dimensions within an order of magnitude of a wavelength of light. Gratings split and diffract an incident light beam into its constituent wavelengths and into several diffracted light beams traveling in different directions. Groove spacing density, depth and profile are some of the factors that affect the spectral range, efficiency, resolution and performance of the diffraction grating. For example, the spacing between grooves, together with the wavelength of the incident light, affects in part the directions of the diffracted light.

Diffraction gratings include reflection gratings and transmission gratings. A reflection type grating reflects incident light, thereby producing diffracted light on the same side of the grating surface as the incident light. In order to reflect an incident light, a reflection grating surface may have a reflective property applied through a reflective coating. A transmission type grating permits incident light to transmit through the grating surface, thereby producing diffracted light on the opposite side of the grating surface from the incident light, also known herein as behind the grating. In order to permit more incident light to transmit through the grating surface, a transmission grating surface may have an antireflective property by means such as an antireflective coating.

Diffraction gratings may be ruled or, holographic. A ruled grating may be produced by a ruling engine that cuts grooves into a grating substrate. A holographic grating may be produced by intersecting light beams that produce a holographic interference pattern on a grating substrate.

SUMMARY

In one embodiment, a wafer level packaging system includes a first plate having an array of optical components such as lenses or spacers and at least one first fiducial, one or several portions of the fiducial including a diffraction grating, in a particular embodiment the first fiducial is aligned to a second, complementary, fiducial provided on a second wafer or photosensor array for aligning the system, and the first wafer and second wafer are attached together. In a particular embodiment, a die cut from the wafer level packaging system forms part of an optical system using at least one lens.

In an alternative embodiment, a method of aligning a first optical wafer with a second optical wafer, involves providing a first type of fiducial at at least two locations on the first optical wafer, each first fiducial having at least a first diffraction grating. Also provided is a second type fiducial having at least a second diffraction grating at at least two locations on the second optical wafer, the first type fiducials being complementary to the second type fiducials. The method then involves positioning the first optical wafer over the second optical wafer and aligning the first fiducial to the second fiducial at the at least two locations on each wafer.

In an alternative embodiment, a method of forming an optical wafer includes aligning a second relief-type diffraction grating fiducial on a second master to a first relief-type diffraction grating fiducial, pressing the second master into a blob, and at least partially curing the blob to form the optical wafer.

In an alternative embodiment, a method of forming an optical wafer includes aligning a second relief-type diffraction grating fiducial on a second master to a first relief-type diffraction grating fiducial on an optical plate formed from a first master. The second master is pressed into a blob of curable polymeric optical material between the aligned optical plate and the second master to shape the blob, and the blob is at least partially cured to form the optical wafer.

BRIEF DESCRIPTION OF THE DRAWINGS

Non-limiting and non-exhaustive embodiments of the invention are described with reference to the following Figures, wherein like reference numerals refer to like parts throughout the various views unless otherwise specified.

FIG. 1A is a cross sectional view of a diffraction grating surface showing an in-plane, single order, transmission type diffraction as known in the art.

FIG. 1B is a cross sectional view of a surface without diffraction grating showing a refraction as known in the art.

FIG. 2 is a perspective view of a diffraction grating surface showing incident light that will result in a conical, transmission type diffraction, as known in the art.

FIG. 3 is a cross sectional view of a diffraction grating surface showing an in-plane, multiple order, transmission type diffraction, as known in the art.

DETAILED DESCRIPTION OF THE EMBODIMENTS

Figure 4:
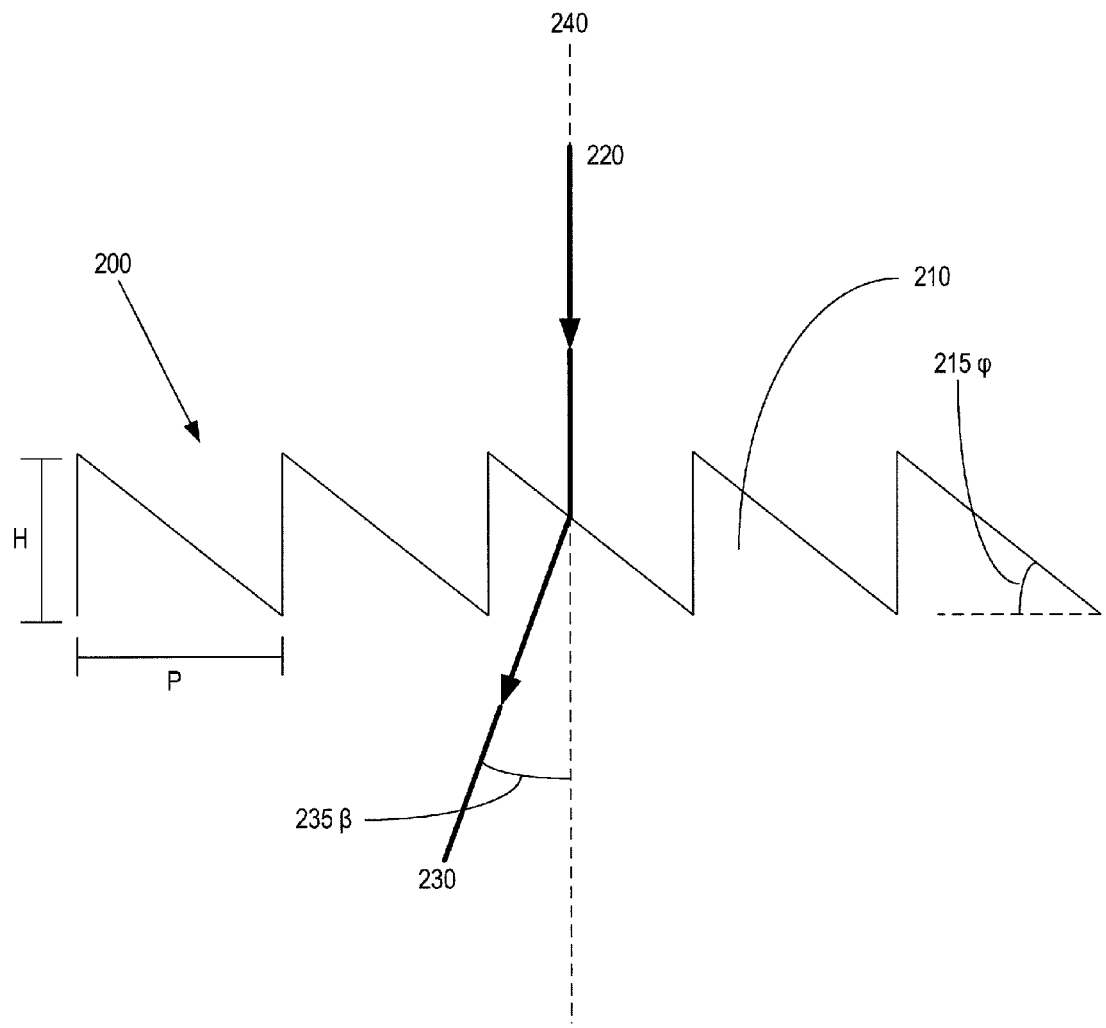
FIG. 4 is a cross sectional view of a diffraction grating surface showing a blazed angle that effectively results in all the diffracted light in a single order, according to an embodiment.

In the following description, numerous details are set forth to provide a thorough understanding of the present invention. In some instances, well-known structures, materials, or operations are not shown or described in detail to avoid obscuring other aspects of the embodiments.

Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As wafers or plates are aligned during wafer level packaging, the diffraction gratings diffract away incident light that reaches the grated portions of the fiducials. As a result, the grated portions of the fiducials appear to be optically dark, and hence contrast sharply against the non-grated portions. This sharp contrast helps to achieve a relatively accurate alignment of the wafers or plates.

FIG. 1A is a cross sectional view of a diffraction grating 100 that includes grating elements 110 that are periodically spaced. The void between two adjacent grating elements 110 is a groove. The distance between the two adjacent grating elements 110 is called groove spacing. The distance P from a center to center of two adjacent grating elements 110 is termed the pitch P. The paper perpendicularly cross-sections the grating elements 110 and the grooves. A normal line 140 is perpendicular to the surface of diffraction grating 100. Incident light 120 strikes diffraction grating 100 at an incident angle $\alpha$ (125), transmits through the grating surface, and is diffracted as diffracted light 130 at a diffraction angle $\beta$ (135).

FIG. 1B is a cross sectional view of a refraction system that does not include grating elements. Here, incident light 120 strikes a non-grated surface 170 at an incident angle $\alpha$ (125), transmits through the non-grated surface, and is refracted as refracted light 160 at a refraction angle $\gamma$ (165). For example, one may observe that diffraction grating 100 may produce diffracted light 130 that bends outwardly away from normal line 140, whereas a non-grated refraction surface may produce refracted light 160 that bends inwardly towards normal line 140 (depending on the refractive indices of materials on both sides of surface 170). This is in part evidenced by the observation that the diffraction angle $\beta$ appears to be larger than the refraction angle $\gamma$ in this example.

Referring to FIG. 1A, one may observe that both incident light 120 and diffracted light 130 are within the plane (i.e., the plane of the paper) that perpendicularly cross-sections grating elements 110 and the grooves. This type of grating system is called classical or in-plane diffraction. In contrast, FIG. 2 shows incident light 120 striking the surface of diffraction grating 100 in a skewed fashion. Here, incident light 120 is not within the plane that perpendicularly cross-sections grating elements 100 and the grooves. Rather, incident light 120 strikes surface 170 at an angle $\epsilon$ (126). Further, the projection line of incident light 120 on surface 170 forms angle $\alpha$ (125) with normal line 140. This type of skewed, non-in-plane diffraction produces diffracted spectra as a cone, and is termed conical diffraction. The in-plane diffraction is a special case of a conical diffraction where $\epsilon=0$.

A mathematical model for the general conical diffraction is the grating equation $$m\lambda = (\cos \epsilon) P(\sin \alpha + \sin \beta) \qquad \text{Eq. 1}$$

For in-plane diffraction, since $\epsilon=0$ and $\cos \epsilon=1$, the grating equation becomes:

$$m\lambda = P(\sin \alpha + \sin \beta) \qquad \text{Eq. 2}$$

where $\lambda$ is the incident light's wavelength, P is the pitch, $\alpha$ is the incident angle, $\beta$ is the diffraction angle, and m is the diffraction order (or the spectral order), which is an integer.

For a given wavelength λ, several values of m correspond to various diffraction orders. FIG. 3 shows a cross sectional view of an in-plane diffraction with three orders, including m=0 producing a zero order diffraction light 180 with a diffraction angle $\beta_0$ (185), m=1 producing a positive first order diffraction light 190 with a diffraction angle $\beta_1$ (195), and m=−1 producing a negative first order diffraction light 130 with a diffraction angle $\beta_{-1}$ (135).

The diffraction order m may be reduced by various means. For example, one may construct a grating in ways that effectively put all the diffracted light into a single, given grating order. One way to achieve this is to cut the grooves so that the grating element fits a particular profile, such as a triangle, including a right triangle.

FIG. 4 illustrates an embodiment wherein the grooves are cut with an angle such that diffraction (as determined from the grating equation) and refraction (as determined by the widely known Snell's law equation) are the same, thereby effectively putting all diffracted light 230 into a single order. FIG. 4 shows an example wherein incident light 220 overlaps with a normal line 240, resulting in an incident angle α=0. In addition, a diffraction grating 200 contains triangular grating elements 210, with a height H and a pitch P. A properly constructed blazed angle φ (215), along with an appropriate refractive index n of the grating material, work collectively to effectively put all diffracted light 230 into a single order, whose diffraction angle β (235) may be determined from the following equation:

$$\sin \beta = n \sin \phi \qquad \text{Eq. 3}$$

When α is not zero (not shown here), the proper blazed angle φ may be determined by simultaneously solving the grating equation and the Snell's law equation.

Diffraction gratings may be produced by various methods. For example, a ruled grating may be produced by using a ruling engine to cut parallel grooves on a grating substrate. A ruled grating diffracts light efficiently but may include defects such as periodic errors, spacing errors and surface irregularities that can result in stray light and ghosting effects. In another example, a holographic grating may be produced by an optical technique of holographic recording.

Figure 5:
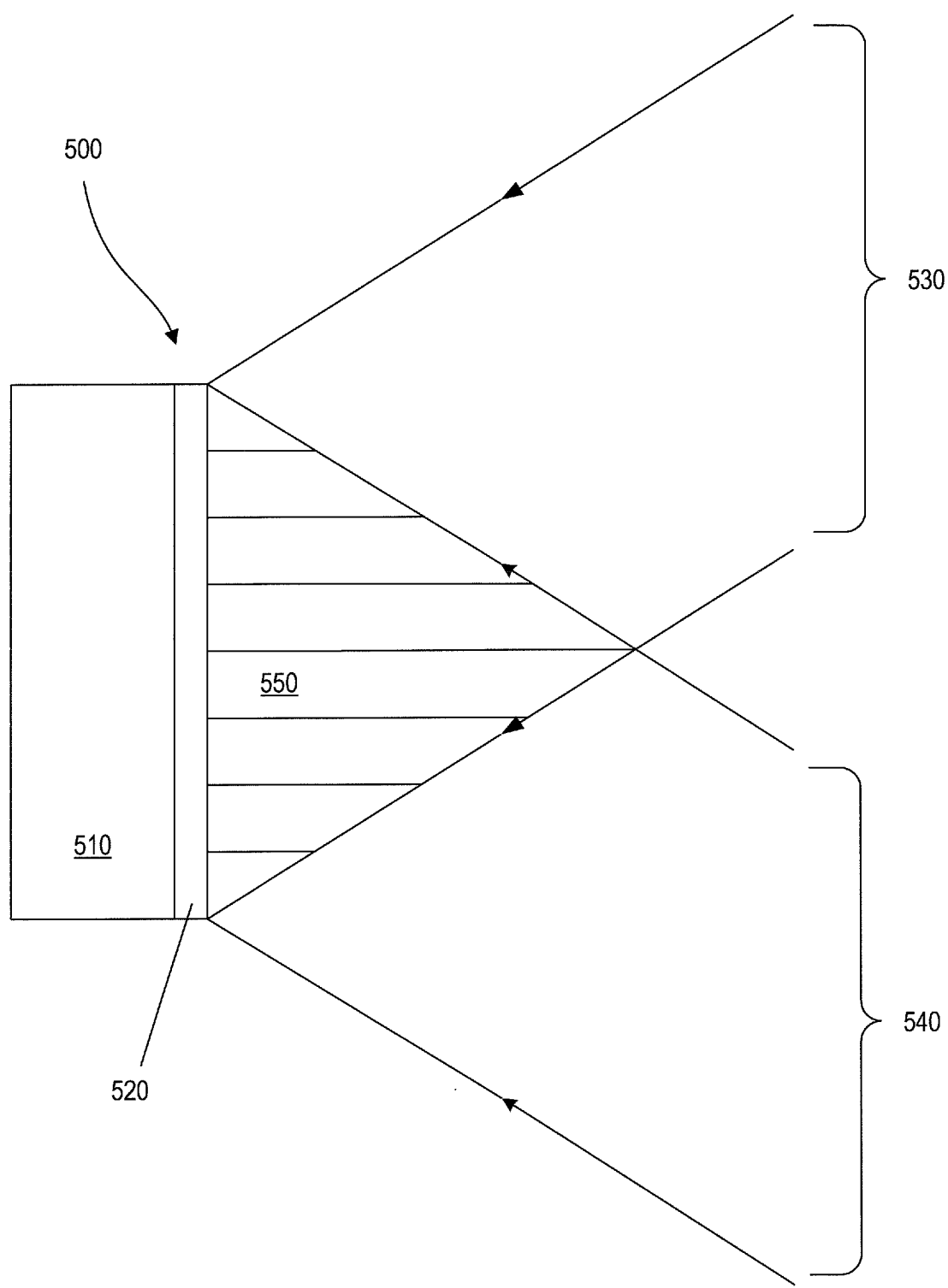
FIG. 5 is a cross sectional view showing several light beams producing an interference pattern on a grating surface, thereby producing a holographic grating, according to an embodiment.

FIG. 5 is a cross sectional view of a holographic diffraction grating 500 manufactured by a photolithographic technique that utilizes a holographic interference pattern. Here, two intersecting light beams 530 and 540, such as laser beams, produce interference fringes 550, which may include equally spaced interference fringes. Interference fringes 550 are formed on a photoresist material 520 on a grating substrate 510. Photoresist material 520 dissolves in proportion to the intensity of interference fringes 550, resulting in holographic grating 500. A holographic grating typically has no periodic errors that may lead to stray light and ghosting effects, but may suffer from lower diffraction efficiency. In yet another example, holographic grating 500 may be additionally blazed to produce a blazed holographic grating. Blazing may be accomplished by techniques such as reactive ion-beam etching. As an example, a holographic grating having a sinusoidal profile may be blazed and transformed into a saw tooth profile. A blazed holographic grating may offer a high diffraction efficiency that is similar to a blazed and ruled grating, but also maintains the low stray light and low ghosting of holographic sinusoidal gratings.

Holographic recording may be produced by various additional means. One example is to use a photoresist material such as a 2-cyanoacrylate sheet containing p-benzoquinone, wherein a photochemical reaction results in a change in refractive index. Another example is to use a silver halide emulsion such as silver chloride or silver bromide, wherein procedures such as light exposure, developing, fixing and washing help to produce a holographic recording. Yet another example is to use a dichromated gelatin, wherein photonic decomposition photochemically crosslinks the gelatin and produces a difference in swelling Yet another example is to use a photopolymer medium, wherein radiation, polymerization and monomer diffusion results in a refractive index modulation, thereby producing a holographic recording. Yet another example is to use a photochromic polymer such as a doped polymethyl methacrylate matrix, wherein a photonic stimulation results in a color change to produce a recording of an interference pattern. Yet another example is to use a photorefractive composition such as a carbazole-substituted polysiloxane derivative, wherein light alters refractive index to produce a recording of an interference pattern. Yet another example is to use a nanoparticle dispersion such as a zirconium oxide nanoparticle dispersed acrylate photopolymer wherein a redistribution of nanoparticles under holographic exposure results in compositional and density difference between bright and dark regions, such differences creating a refractive index grating. Yet another example is to use a photoactive liquid crystalline polymer such as an azobenzene-containing polymer, wherein a photo-initiated phase transition between a nematic state and an isotropic state modulates refraction index to produce a recording of a holographic interference pattern. Yet another example is to use a sol-gel matrix such as a tetraethoxy silane sol-gel glass, wherein photopolymerization or crosslinking produces a recording by modulating refractive index. Yet another example is to use polyelectrolytes as a holographic recording medium, wherein lithography techniques and heating produce a recording.

Figure 6A:
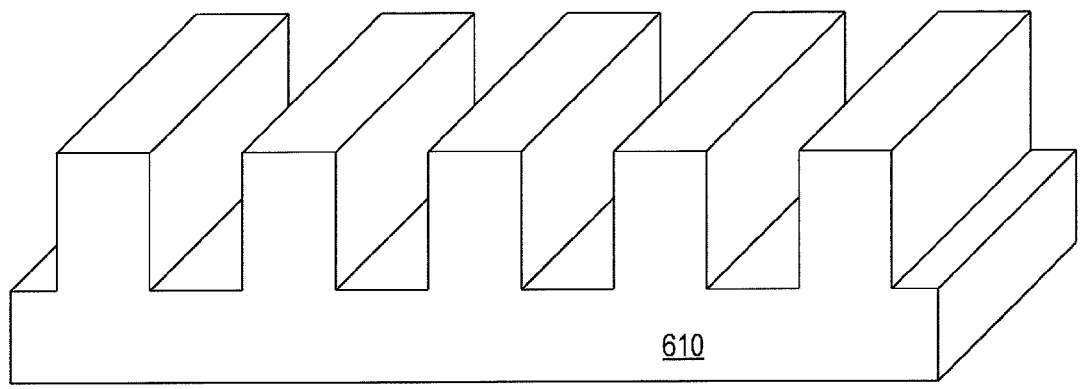
FIG. 6A is a perspective view of a rectangular shaped grating, according to an embodiment.
Figure 6B:
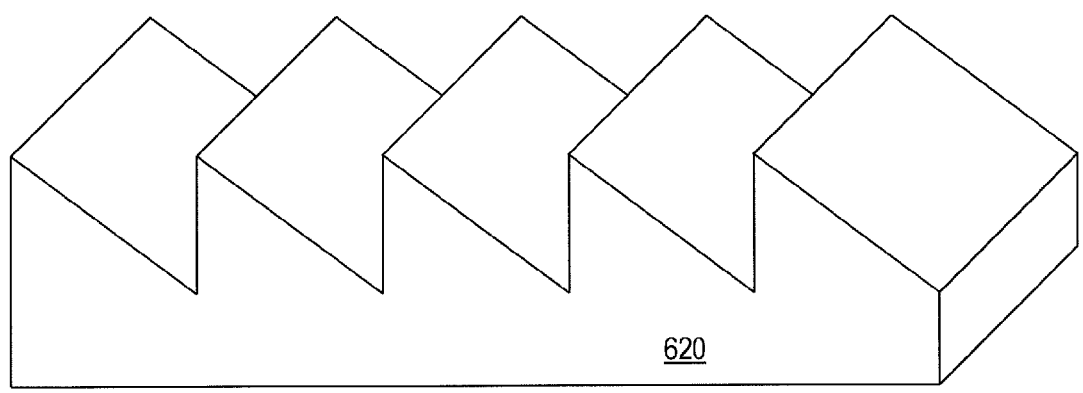
FIG. 6B is a perspective view of a blazed triangular shaped grating, according to an embodiment.

Diffraction gratings may be produced on surfaces with various curvature features including, for example, flat, concave, and convex features, or a combination thereof. Diffraction gratings may be constructed to include various configurations or profiles. For example, a diffraction grating may have a square profile 610 as shown in a perspective view in FIG. 6A. In another example, a diffraction grating may have a blazed, triangular, saw tooth profile 620, as shown in FIG. 6B. Gratings having a triangular or sawtooth profile, including a type wherein the profile is a right triangle, are sometimes referred to as blazed gratings, and may be produced by a ruling engine that cuts grooves on a grating substrate. Blazed gratings diffract light efficiently but may include defects such as periodic errors, spacing errors and surface irregularities that can result in stray light and ghosting effects.

Figure 6C:
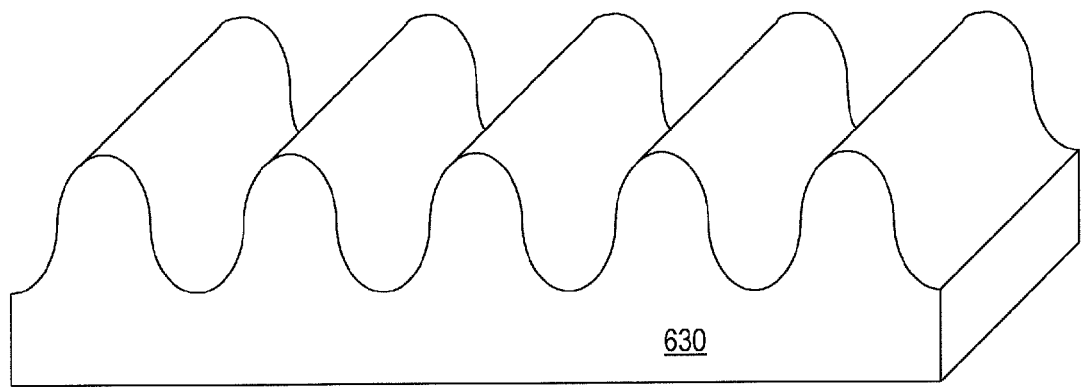
FIG. 6C is a perspective view of a holographic sinusoidal shaped grating, according to an embodiment.
Figure 6D:
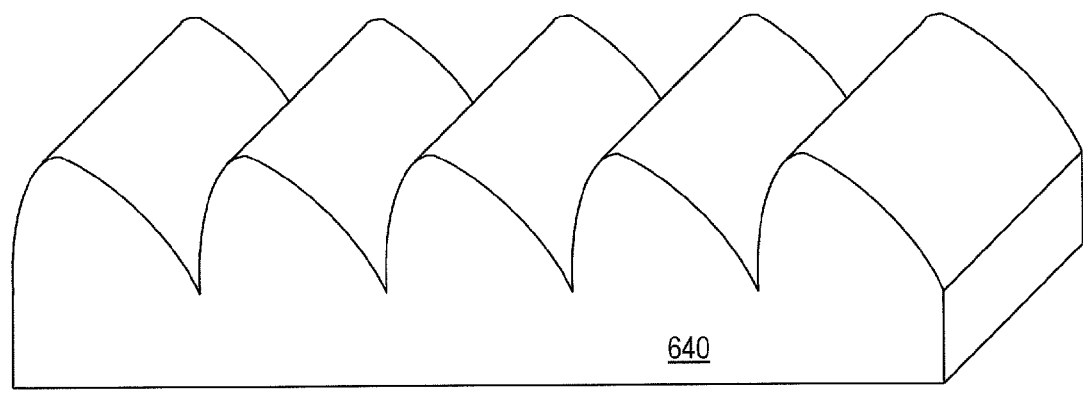
FIG. 6D is a perspective view of a blazed holographic grating with a triangular profile having relatively smooth edges, according to an embodiment.

A diffraction grating may also have a sinusoidal profile 630, as shown in FIG. 6C. In another example, a diffraction grating may have a triangular, saw tooth profile 640 with relatively smooth edges, as shown in FIG. 6D. Gratings having triangular sawtooth profiles with smooth edges are sometimes referred to as blazed holographic gratings, and may be produced by methods that blaze a holographic grating, an example of which is described in the following paragraph and illustrated in FIGS. 7A, 7B and 7C. Blazed holographic gratings may offer high diffraction efficiency, similar to blazed ruled gratings, while maintaining the effects of low stray light and no ghosting achieved by holographic gratings.

Figure 7A:
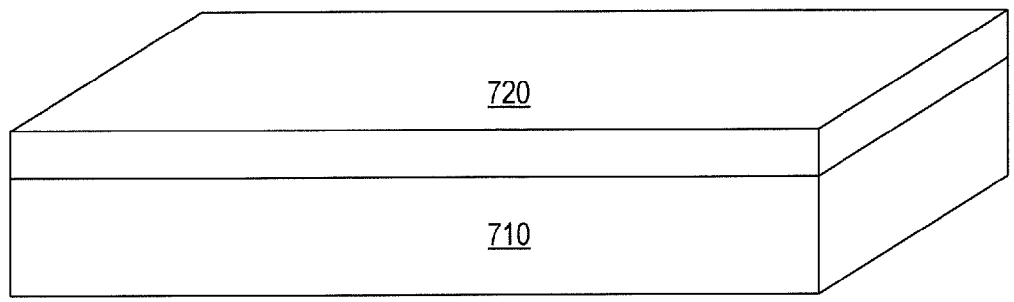
FIG. 7A is a perspective view of a grating substrate topped with a photoresist layer, according to an embodiment.
Figure 7B:
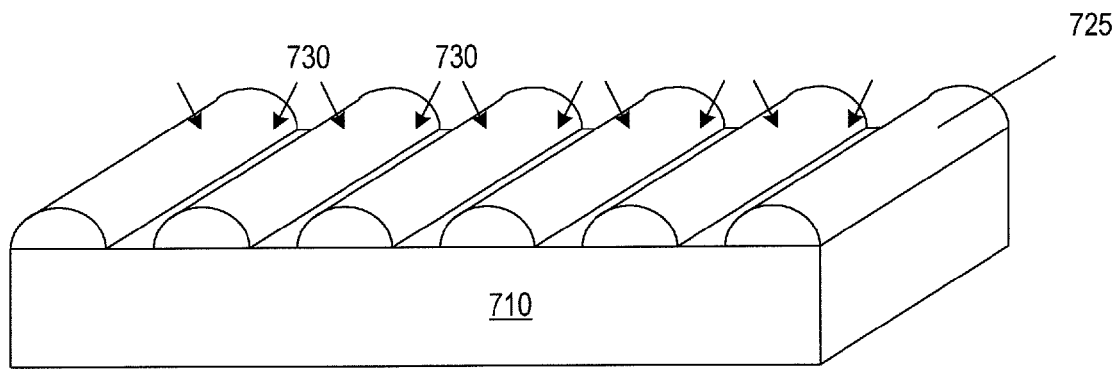
FIG. 7B is a perspective view of laser beams exerting effects of holographic exposure and developing on the photoresist layer of FIG. 7A.
Figure 7C:
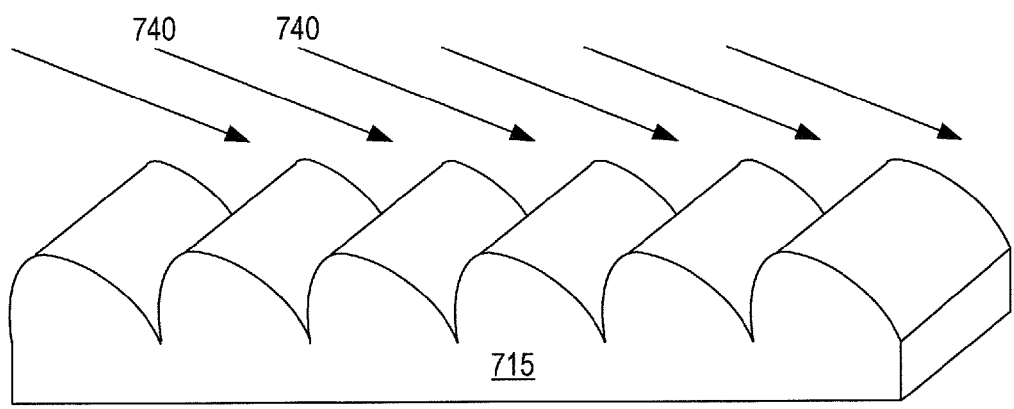
FIG. 7C is a perspective view of reactive ion beams etching a pattern into the holographically exposed and developed resist layer of FIG. 7B, thereby producing a blazed holographic grating.

FIG. 7A is a perspective view of a photoresist material 720 on top of a grating substrate 710. When photoresist material 720 is exposed to interfering laser beams 730, as shown in FIG. 7B, it dissolves in proportion to the intensity of the interference fringes, thereby producing a holographic grating profile 725. A subsequent etching process, such as a reactive ion etch 740, blazes the holographic grating to produce a blazed holographic grating 715, as shown in FIG. 7C. By way of example, blazed holographic grating 715 may include a saw tooth profile with relatively smooth edges.

Figure 8A:
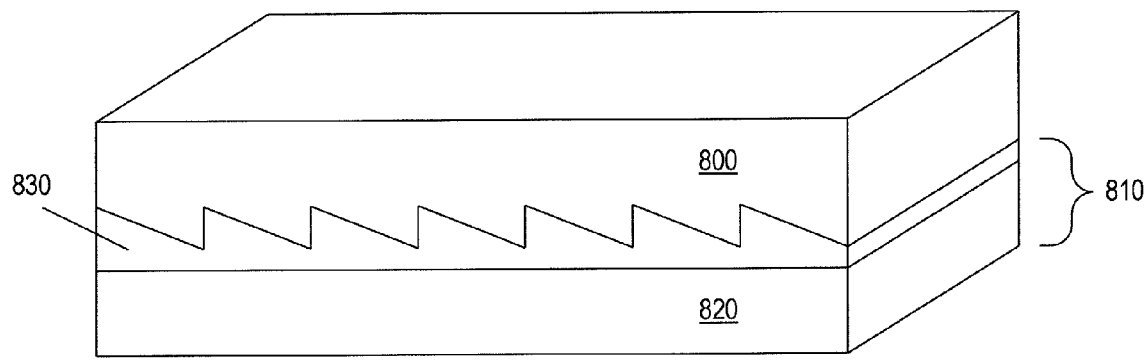
FIG. 8A is a perspective view showing a replica grating matching a master grating during a replicating process, according to an embodiment.
Figure 8B:
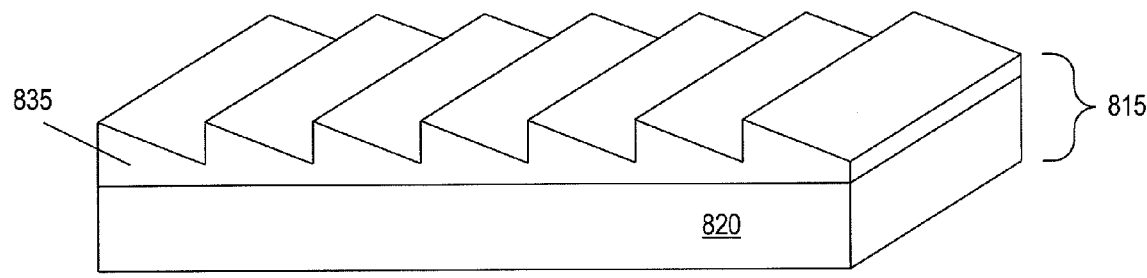
FIG. 8B is a perspective view showing a replica grating after parting from the master grating, according to an embodiment.

To reduce the cost of producing diffraction gratings, one may first produce a master grating by using techniques such as ruling, milling, holographic recording, reactive ion-beam etching, and other processes, and then produce a multitude of less expensive replica gratings that are based on the master grating. Replica gratings may be made by techniques such as molding and stamping. An example of the replication techniques is illustrated by FIGS. 8A and 8B. First a master grating 800 having a saw tooth profile is produced by a technique such as ruling or photolithography. Then, an unmolded replica grating precursor 810 having a substrate 820 with at least a layer of deformable material 830 is pressed onto to master grating 800, as shown in FIG. 8A. Examples of deformable material 830 include an ultraviolet ("UV") epoxy, which solidifies after being pressed to the master grating 800 followed by UV light exposure, and a thermoplastic similar to that used for stamping compact discs ("CDs"), which is deformable when hot but hardens upon cooling. After parting, a molded replica grating 815 has a saw tooth profile 835 mirroring that of master grating 800, as shown in FIG. 8B; the saw-tooth profile 835 making molded replica grating 815 a blazed grating.

Throughout this disclosure, a replica grating may be associated with similar terminology to that used to characterize the master grating that is used to produce the replica grating. For example, a replica grating produced from a blazed master grating may be called a blazed grating, even though a molding technique is used to produce this replica grating. In another example, a replica grating that is produced from a holographic master grating may often be called a holographic grating, even though a molding technique is used to produce this replica grating from the master.

Transmission or reflection type diffraction, including reduced order diffraction, may be applied in wafer level optics to improve manufacturing processes. One embodiment sharpens the contrast levels of fiducials on wafers or lens plates during the alignment of these sheet structures. For example, when optical components like lenses of wafer level cameras are molded or embossed onto a wafer, the stamp plate and the wafer or lens plate should be accurately aligned. Similarly, optical components such as baffles and spacers formed on a plate, should be aligned to underlying image sensors (since image sensors have an array of multiple photosensors, they are also known herein as photosensor arrays), or overlying structures such as lenses. In another example, when several opto-wafers such as one or more of lens plates, photosensor arrays, optical absorbers and baffles, protective windows, or other structures are assembled during wafer level packaging, they often need to be accurately aligned so that various layers of optical elements are stacked in proper alignment and attached to each other prior to separating the stacked plates into individual optical assemblies. For example, a lens structure for a wafer-level camera may have a compound lens having a plurality of lens components, such as lenses, optical baffles, and spacers, where several components originate from separate lens plates and which should be properly aligned in a final optical assembly. Typically each optical wafer has an array having multiple optical elements such as lenses, absorbers, baffles, and/or spacers, and each final optical assembly has one optical element cut from each optical wafer of the stacked plates.

Figure 9A:
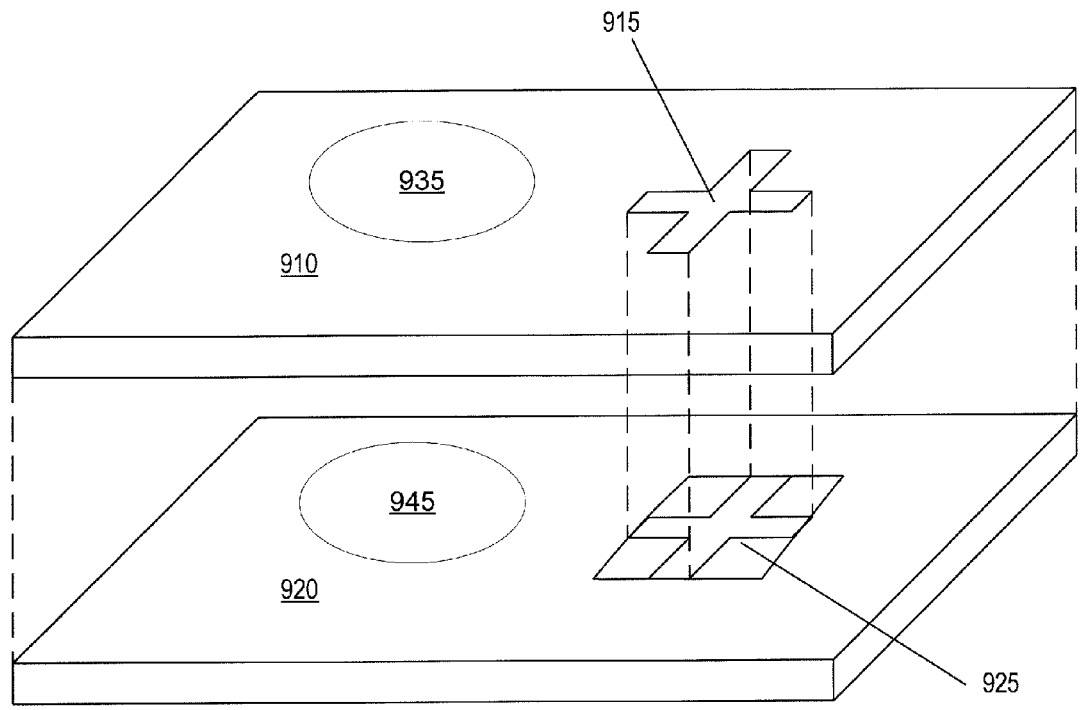
FIG. 9A is a perspective view of two lens plates being aligned during wafer level packaging, wherein the fiducials on the lens plates facilitate accurate alignment, according to an embodiment.
Figure 9B:
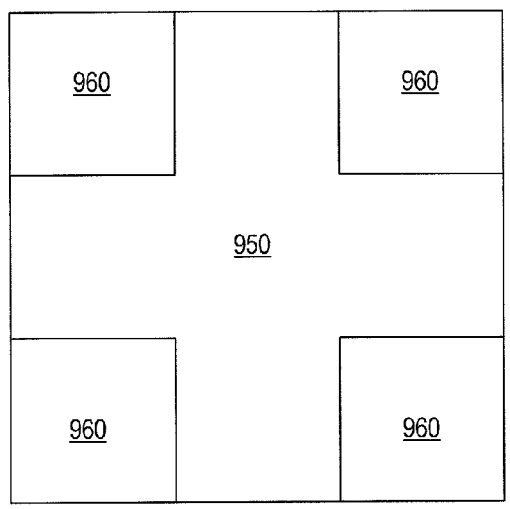
FIG. 9B is a planar view of a fiducial that does not include a diffraction grating, according to an embodiment.
Figure 10A:
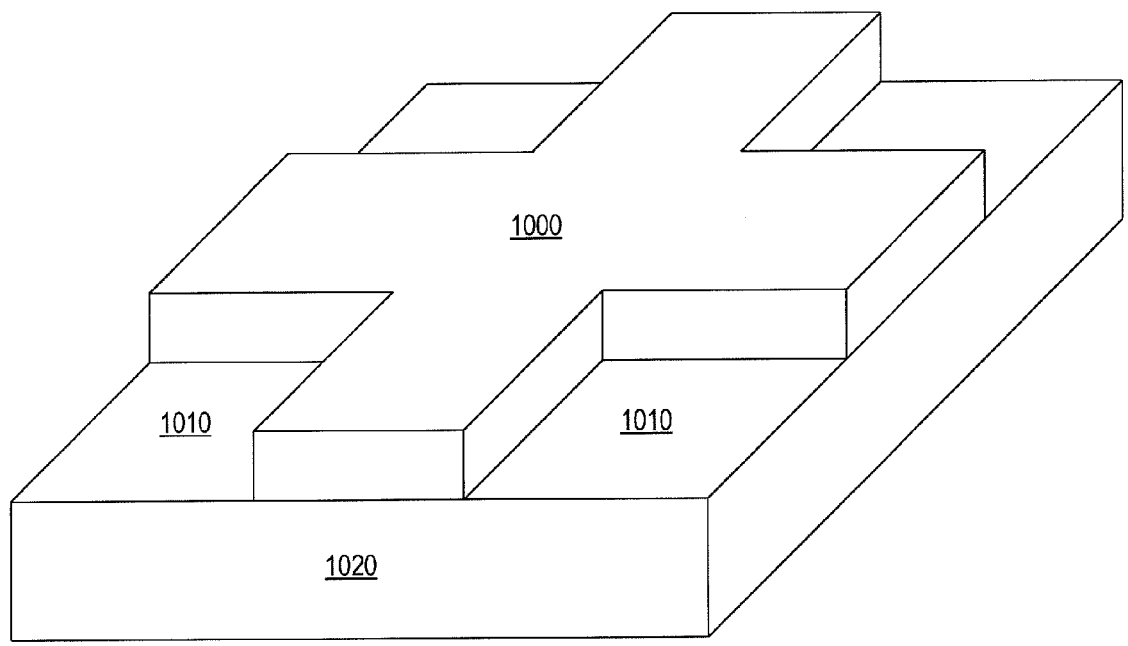
FIG. 10A is a perspective view of a raised relief-type fiducial that does not have a diffraction grating, according to an embodiment.

Several techniques, including the use of fiducials, light microscopy and differential interference contrast, may be applied to ensure accurate alignment. Fiducials are reference objects or alignment marks on plates that help to align the plates accurately so that structures, such as compound lenses, having portions cut from more than one plate or wafer align and function correctly. For purposes of this document, a second fiducial having structures suitable for alignment to a first fiducial is referred to as a fiducial complementary to the first fiducial. A complementary fiducial may, but need not, be a negative image of part or all of the first fiducial. As an example, the cross fiducial of FIG. 10A is complementary to the four-squares fiducial of FIG. 10B. Other fiducial and complementary fiducial pairs are possible. FIG. 9A is a perspective view that shows an accurate alignment of first and second plates 910 and 920 by aligning a first fiducial 915, on first plate 910, and a second, complementary, fiducial 925, on second plate 920, with the help of a mask aligner (not shown). First plate 910 includes at least a lens 935, and second plate 920 includes at least an element 945 such as a lens, a spacer or baffle, or a photosensor. Fiducials may have various configurations. For example, an alignment fiducial may include a cross shaped center 950 on one of the plates that is aligned to several rectangular shaped surrounding areas 960 on another of the plates, as shown in FIG. 9B.

To assist in alignment, fiducials may be present at several points on each wafer. In embodiments having fiducials at two or more points on the wafer, alignment of at least two first fiducials of one wafer to at least two complementary second fiducials of a second wafer provides adjustment and alignment for wafer rotation as well as X and Y coordinate offsets.

Figure 13A:
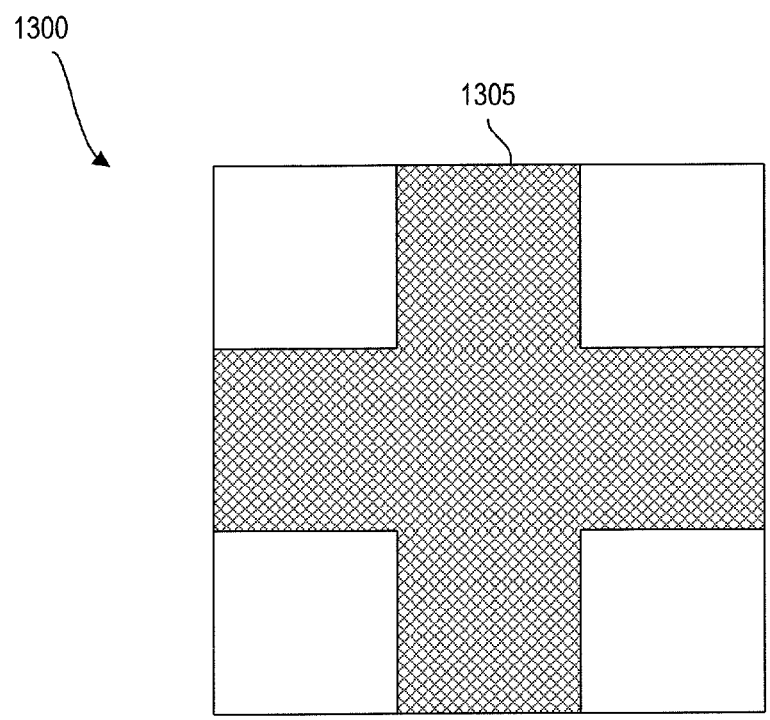
FIG. 13A is a planar view of a raised relief-type fiducial wherein the pedestal includes a diffraction grating, according to an embodiment.

A method of aligning in both X, Y, and rotation a first and a second plate includes providing at least two relief-type first fiducials such as those illustrated in FIG. 13A on the first plate, these are fiducials A and B. Further provided are at least two relief-type second fiducials C and D such as those illustrated in FIG. 13B on the second plate, the second fiducials being complementary to the first fiducials. The first plate is placed over the second plate, such that the A first fiducial overlies second fiducial C, and first fiducial B overlies second fiducial D. The A and C fiducials are viewed simultaneously as a pair, similarly the B and D fiducials are simultaneously viewed as a pair. Adjustments in position and/or rotation of, for example the first plate, are made while simultaneously or alternately viewing the pairs of fiducials until the first plate is properly aligned to the second plate as determined by alignment of both pairs of fiducials to a predetermined tolerance, once this position is reached the plates are deemed aligned. In some embodiments, the adjustments in position are made manually or by a manually operated machine. In other embodiments, a computer views the fiducials and the adjustments in position automatically. Once the plates are aligned, they may be attached to each other or to other components to fix optical elements of the plates in proper relative position, a step known herein as bonding.

Figure 10B:
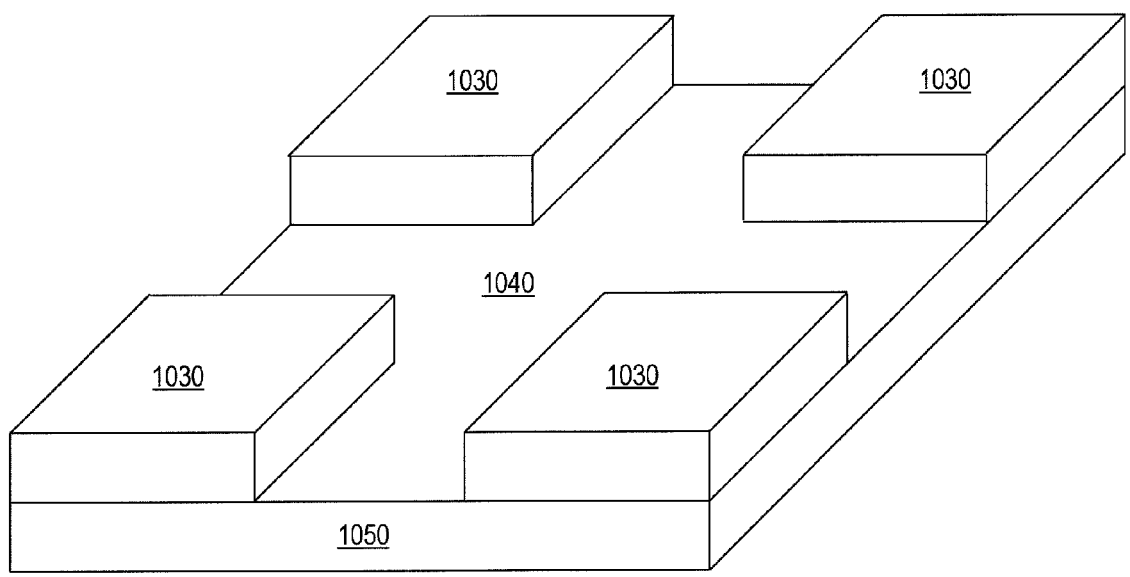
FIG. 10B is a perspective view of a sunken relief-type fiducial that does not have a diffraction grating, according to an embodiment.

Fiducial objects may be of several types. In one example, a fiducial is formed by applying a polymer to a wafer or plate to form a raised, colored, or opaque structure. In another example, a fiducial is produced as a raised relief structure 1020 as shown in FIG. 10A, with a cross shaped pedestal 1000 and several sunken background areas 1010 surrounding pedestal 1000. In another example, a fiducial is produced as a sunken relief structure 1050 as shown in FIG. 10B, with several pedestals 1030 surrounding a central, cross shaped sunken area 1040. The pedestals in raised or sunken relief-type fiducials (e.g., pedestal 1000 or pedestals 1030) may have varying heights depending on design specifications. Generally speaking, relatively low pedestal or fiducial heights produce relatively low fiducial contrast to surrounding areas of the plate. For example, a 3 to 5 micrometer height produces a moderate fiducial contrast.

To increase fiducial contrast, thereby easing alignment, it is helpful to render parts of the fiducial optically opaque. For example, the central cross area of a fiducial may be rendered optically opaque. This may be accomplished by dispensing an opaque polymer onto the area. In another embodiment, a diffraction grating may be applied to the area to diffract away light, thus making the area appear optically opaque. The diffraction grating may include a transmission type grating and/or a reflection type grating. In particular, a reflection-type grating may be applied to a photosensor array integrated circuit during fabrication of that integrated circuit as a shape formed from multiple parallel segments of metal lines. The shape of a reflection type grating formed on a photosensor array may be made complementary to a relief-type fiducial having a transmission-type grating on an optical wafer such that the optical wafer may be aligned to the fiducial on the photosensor array. In an embodiment, one or more first relief-type fiducial having diffraction grating is formed on a first optical wafer and aligned to one or more second fiducials having diffraction gratings on a second optical wafer. One or more third relief-type fiducials having a diffraction grating on the second optical wafer is then aligned to one or more fourth fiducial including a diffraction grating formed as a pattern of multiple parallel segments of metal lines on a photosensor array underlying both optical wafers. At each level, two or more of each fiducial type are used if alignment in rotation as well as alignment in X and Y axes is desired.

In an alternative embodiment, the fourth fiducial is formed as one or more metal shapes formed on the photosensor array and does not include a diffraction grating.

Figure 11A:
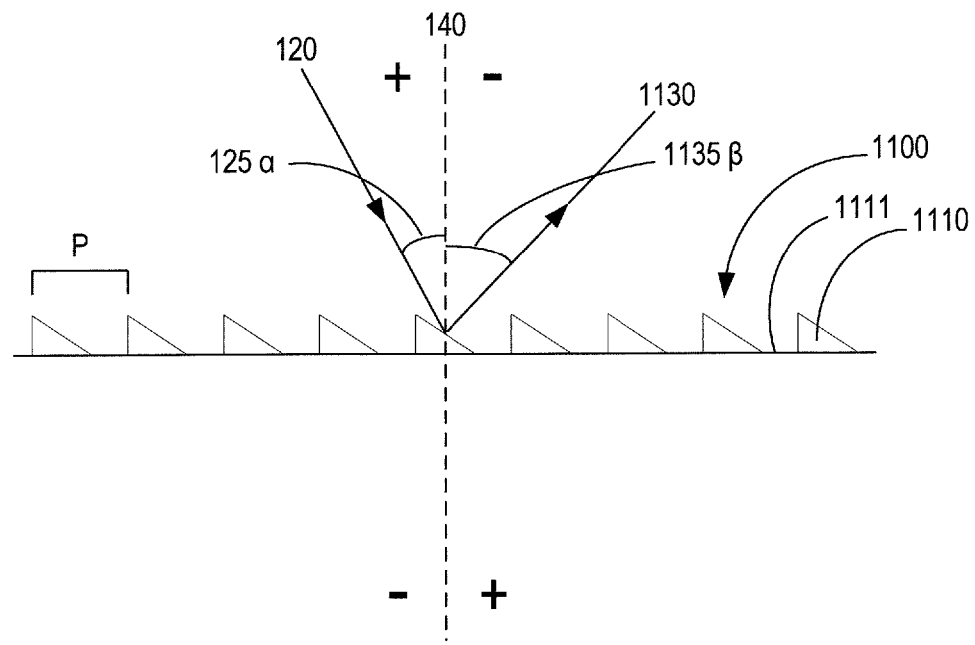
FIG. 11A is a cross sectional view of a diffraction grating surface showing an in-plane, single order, reflection type diffraction, according to an embodiment.

FIG. 11A is a cross sectional view of a diffraction grating 1100 that includes periodically spaced grating elements 1110. The void between two adjacent grating elements 1110 is called a groove. The distance between the two adjacent grating elements 1110 is groove spacing, the distance from center to center of adjacent grating elements 1110 is the pitch P. FIG. 11A illustrates a perpendicular cross-section of grating elements 1110 and grooves 1111. A normal line 140 is perpendicular to the surface of diffraction grating 1100. Incident light 120 strikes diffraction grating 1100 at an incident angle α (125), reflects off the grating surface, and is diffracted as diffracted light 1130 at a diffraction angle β (1135).

Figure 11B:
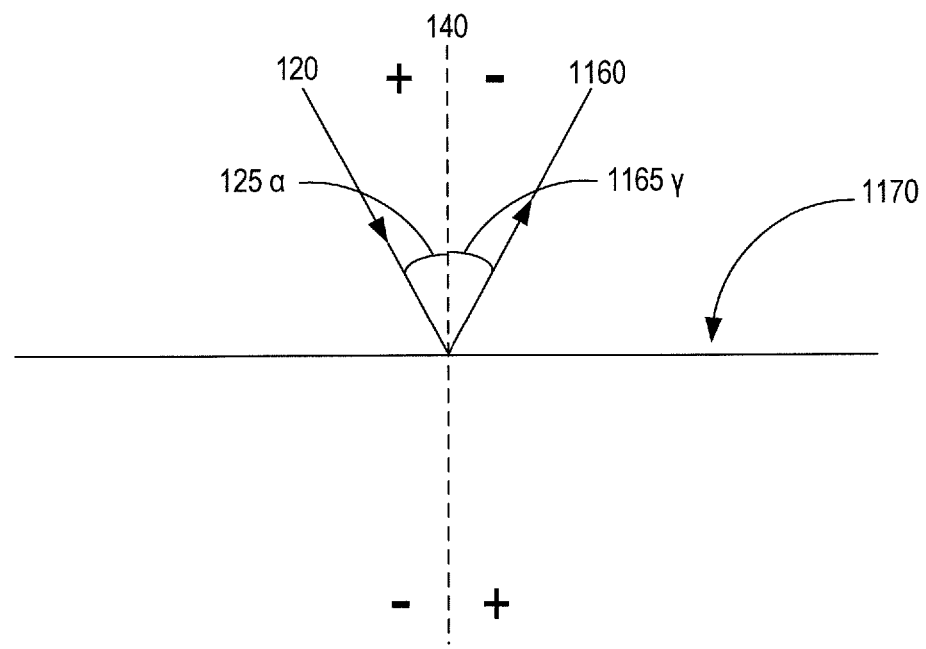
FIG. 11B is a cross sectional view of a surface without diffraction grating showing a reflection.

FIG. 11B shows a cross sectional view of a reflection system that does not include grating elements. Here, incident light 120 strikes a non-grated surface 1170 at an incident angle α (125), reflects off non-grated surface 1170, and is reflected as reflected light 1160 at a reflection angle γ (1165). The law of reflection suggests that incident angle α has the same absolute value as reflection angle γ. For example, diffraction grating 1100 may produce diffracted light 1130 that bends outwardly away from normal line 140, whereas a non-grated surface may produce reflected light 160 that bends inwardly towards normal line 140 (as compared with diffracted light 1130). In this example, diffraction angle β is larger than reflection angle γ.

A reflection type diffraction may have several diffraction orders, which may be reduced by various means. For example, one may construct a grating in ways that effectively put all the diffracted light into a single, given grating order. One way to achieve this is to construct the grooves (e.g., grooves 1111) so that the grating elements (e.g., elements 110) fit a particular profile, such as a triangle with a properly constructed blazed angle that helps to effectively put all the diffracted light into a single order, similar to FIG. 4 but in reflection mode.

Figure 12A:
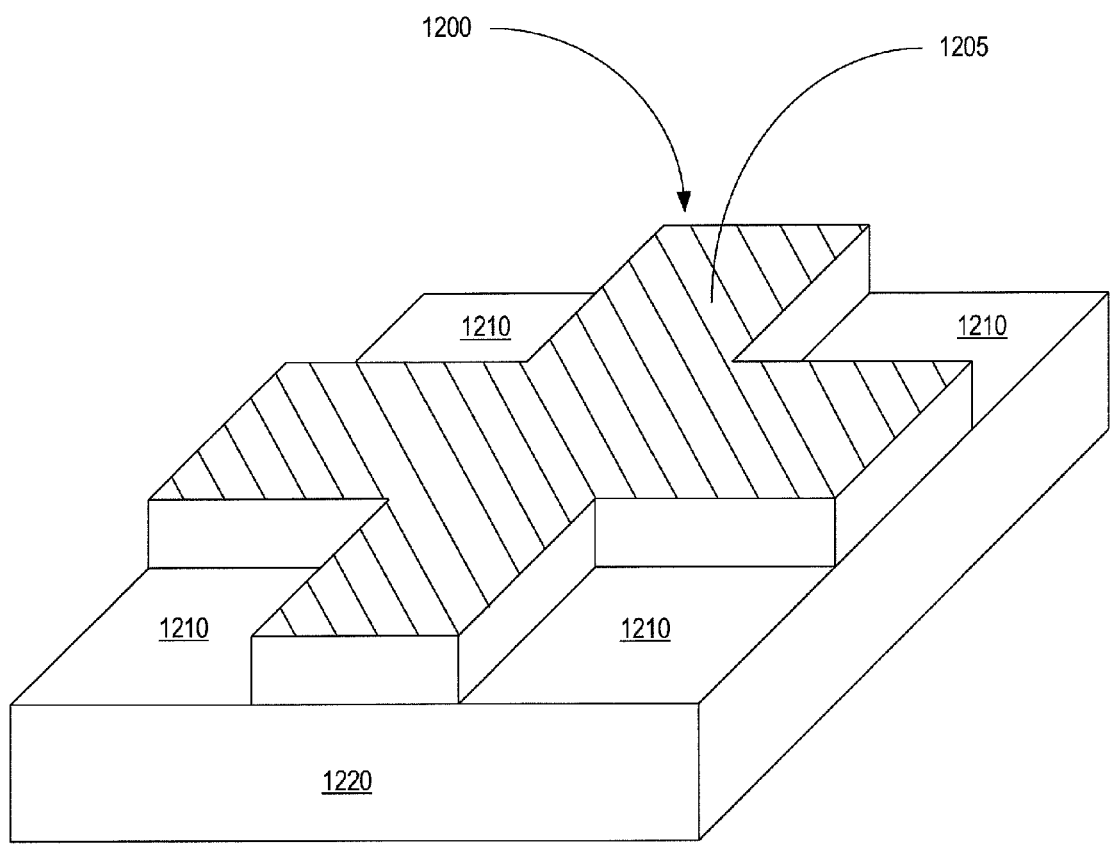
FIG. 12A is a perspective view of a raised relief-type fiducial wherein the pedestal includes a diffraction grating, according to an embodiment.

FIG. 12A is a perspective view of a raised relief-type fiducial 1220 that includes a cross shaped central pedestal 1200 and several surrounding, sunken background areas 1210. Pedestal 1200 includes a diffraction grating 1205. Diffraction grating 1205 may be of a type as disclosed in this application. Its properties may include reflection, transmission, ruled, blazed, photolithographic, holographic, blazed holographic, planar, concave, convex, single order, multiple order, etc. Diffraction grating 1205 may include grooves that have varying values of pitch and depth, and/or have varying configurations and orientations. For example, as shown in FIG. 12A, diffraction grating 1205 includes grooves that are oriented at an oblique angle, such as 45 degrees, relative to the edges of pedestal 1200.

Figure 12B:
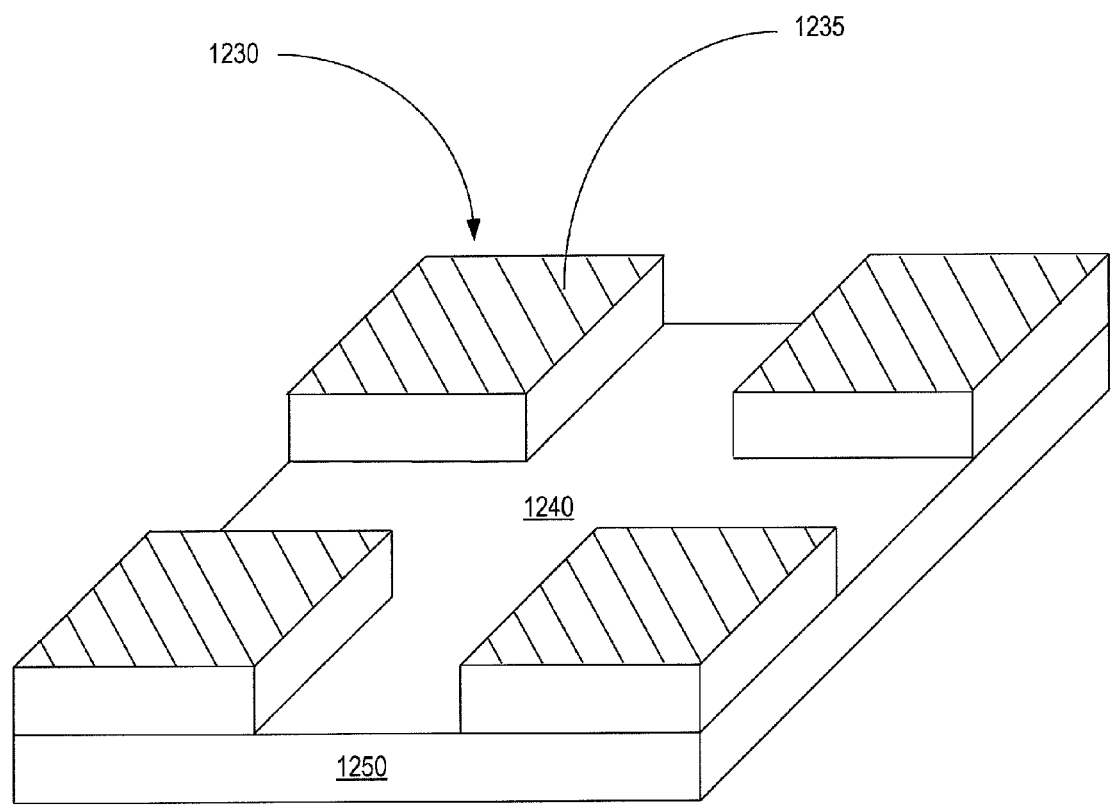
FIG. 12B is a perspective view of a sunken relief-type fiducial wherein the surrounding pedestals include diffraction gratings, according to an embodiment.

FIG. 12B is a perspective view of a sunken relief-type fiducial 1250 that includes several pedestals 1230 surrounding a central, cross shaped, sunken area 1240. Pedestals 1230 include diffraction gratings 1235. Diffraction gratings 1235 may be of a type as disclosed in this application. Their properties may include reflection, transmission, ruled, blazed, photolithographic, holographic, blazed holographic, planar, concave, convex, single order, multiple order, etc. Diffraction gratings 1235 may include grooves that have varying values of pitch and depth, and/or have varying configurations and orientations. For example, as shown in FIG. 12B, diffraction gratings 1235 include grooves that are oriented at an oblique angle, such as 45 degrees, relative to the edges of pedestals 1230.

Figure 13B:
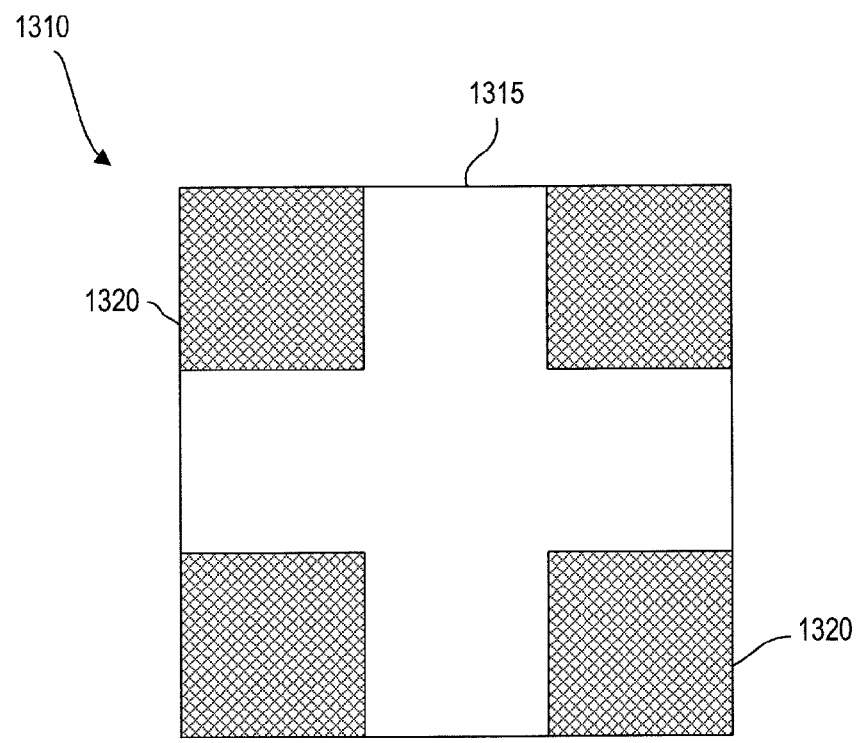
FIG. 13B is a planar view of a sunken relief-type fiducial wherein the surrounding pedestals include diffraction gratings, according to an embodiment.
Figure 13C:
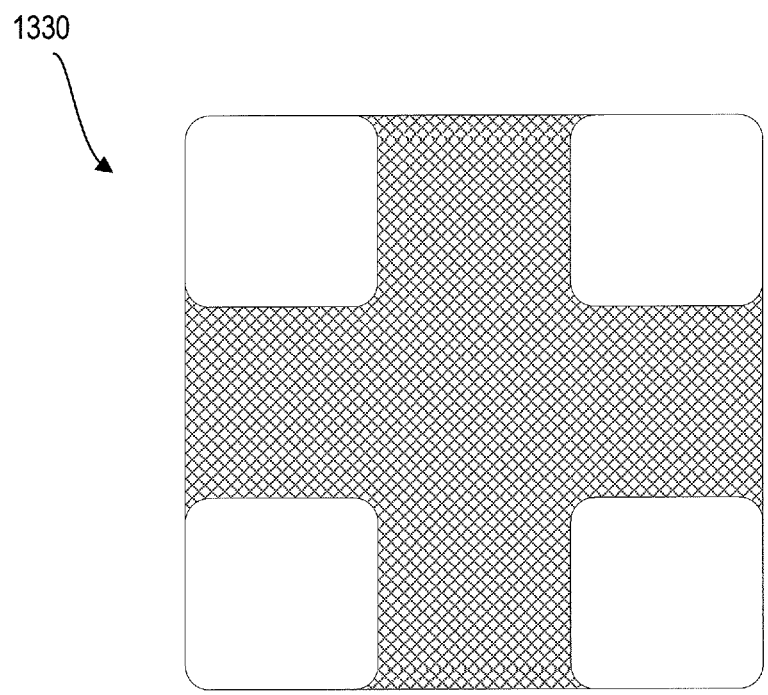
FIG. 13C is a planar view of a raised relief-type fiducial wherein the rounded pedestal includes a diffraction grating, according to an embodiment.
Figure 13D:
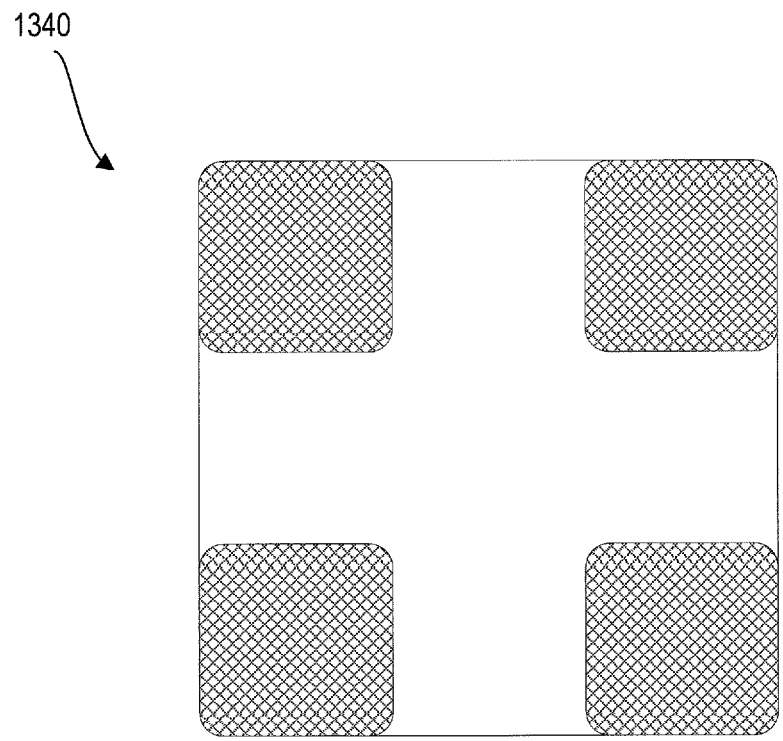
FIG. 13D is a planar view of a sunken relief-type fiducial wherein the rounded, surrounding pedestals include diffraction gratings, according to an embodiment.

Of the fiducials disclosed herein, the parts that do not have diffraction gratings may have a relatively high reflectivity, thereby appearing relatively bright in a field of view. On the other hand, the parts that have diffraction gratings may diffract light out of the field of view, thereby appearing relatively dark. FIG. 13A is a planar view of a fiducial 1300 wherein its central part 1305 is grated, according to an embodiment. FIG. 13B is a planar view of an embodiment of a fiducial 1310 wherein surrounding parts 1320 surrounding a central part 1315 are grated. FIGS. 13C and 13D show similar fiducials 1330 and 1340, respectively, wherein certain parts include rounded features.

Fiducial-containing plates may be aligned by automation or by manual means. For example, a top plate containing a fiducial as shown in FIG. 13A is aligned with a bottom plate containing a complementary fiducial as shown in FIG. 13B. When accurately aligned, these fiducials superimpose such that the resulting field of view of the fiducials becomes uniformly dark (as indicated by cross-hatched areas of FIGS. 13A-13D, although the cross-hatching is not a physical appearance of the fiducials but a representation of height, with cross-hatched areas being raised above white areas). An automated alignment process may be designed to take advantage this phenomenon of view change. For example, the alignment may include a feedback operation to achieve superimposition of the fiducials.

To reduce the cost of producing diffraction gratings on fiducials, one may first produce an expensive fabrication master, and then produce a multitude of inexpensive replica fiducials based on the master, with the help of replication techniques such as molding. The master may be made of various materials including metal, polymer, glass, etc. The master may be grated by various techniques including ruling, holographic recording, photolithography, ion beam etching, milling, etc. For example, a metal fabrication master may be subjected to a milling operation using a custom milling tool in order to generate gratings. Such a milling method may allow production of a grated master at reasonable cost, vis-à-vis conventional grating methods such as ruling and holographic recording. One example of a custom milling tool is a single flute, mono-crystalline diamond milling tool that includes specific geometry and cutting parameters, which produce desirable grating characteristics including a proper blazing angle, a proper grating pitch, and/or a proper grating height.

Figure 14A:
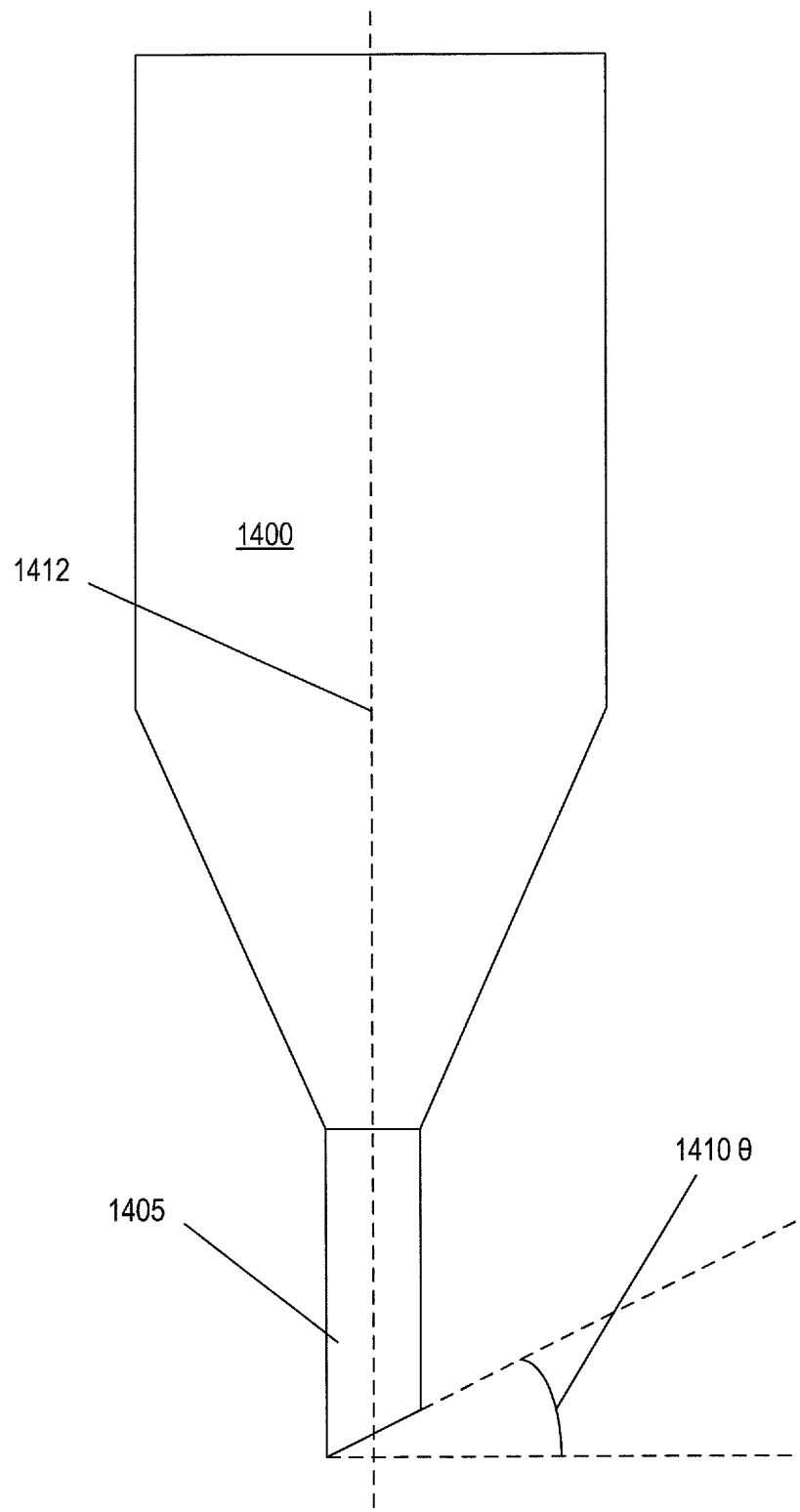
FIG. 14A is a cross sectional view of a custom milling tool that includes a milling tip with a blazing angle, according to an embodiment.
Figure 14B:
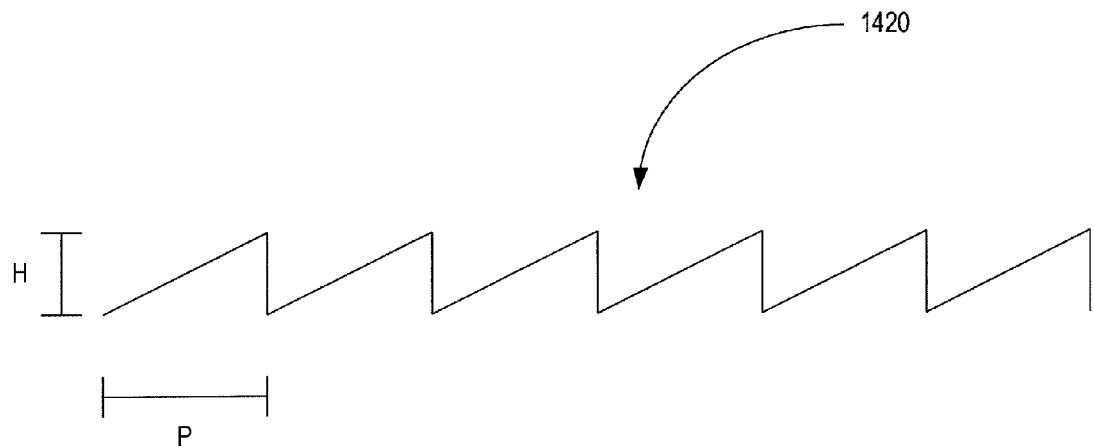
FIGS. 14B-14D are cross sectional profiles of several milled gratings, according to embodiments.
Figure 14C:
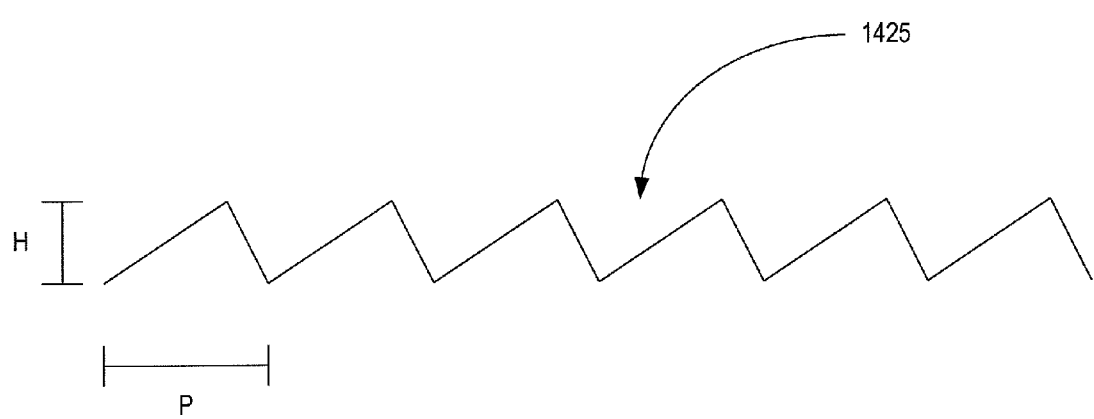
Figure 14D:
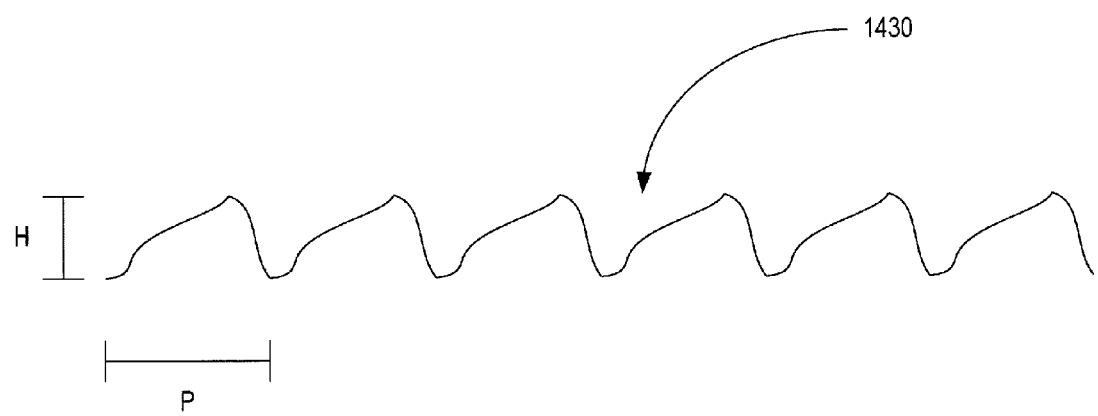

FIG. 14A is a cross sectional view of a custom milling tool 1400 that includes a single flute mono-crystalline diamond milling tip 1405. The profile of tip 1405 has a blazing angle θ (1410). Compared with a ruling engine, which may produce substantially straight and parallel grooves by using a reciprocal cutting motion, custom milling tool 1400 produces substantially circular grooves in a master grating of a fiducial by using a circular cutting motion about an axis 1412; however the circular grooves are displaced from circle to circle. While the resulting grooves have spacing that varies with an offset along an axis perpendicular to the axis of displacement, portions of each circular line forms an arcuate line because a portion of a circle is an arc. The portions of the arcuate lines that are used in a particular grating have sufficiently uniform spacing to perform predictable diffraction. The cross sectional profiles of milled gratings are substantially similar to those of ruled gratings. FIGS. 14B-14D show cross sectional profiles of several milled gratings, including a blazed, right triangular profile 1420 (FIG. 14B), an almost blazed, oblique triangular profile 1425 (FIG. 14C), and a relatively realistic, approximately triangular profile 1430 (FIG. 14D). In a milling operation, the grating pitch P is determined by factors such as spindle speed and feed rate of the master under the milling tool. Further, the grating height H is determined by factors such as grating pitch P and blazing angle θ. For example, with a single flute milling tip, a spindle speed of 35,000 revolutions per minute and a feed rate of 87.5 millimeters per minute may produce a grating pitch of 2.5 micrometers. Further, a grating pitch of 2.5 micrometers and a blazing angle of 30 degrees may produce a theoretical grating height of 1.4 micrometers; however actual gratings produced will tend to be somewhat lower than this. In another example, a milling operation using a spindle speed of 35,000 revolutions per minute and a feed rate of 52.5 millimeters per minute produced a pitch of 1.5 micrometers. Further, with a 30 degree blazing angle, the milling operation produced a 0.87 micrometer height. In yet another example, a 0.936 micrometer pitch and a 32.89 degree blazing angle produced a theoretical height of 0.6 micrometer. Other blazing angles may be used, such as between 20 and 45 degrees. In an embodiment the blazing angle is determined to produce single-mode diffraction of a predetermined wavelength of light.

Figure 14E:
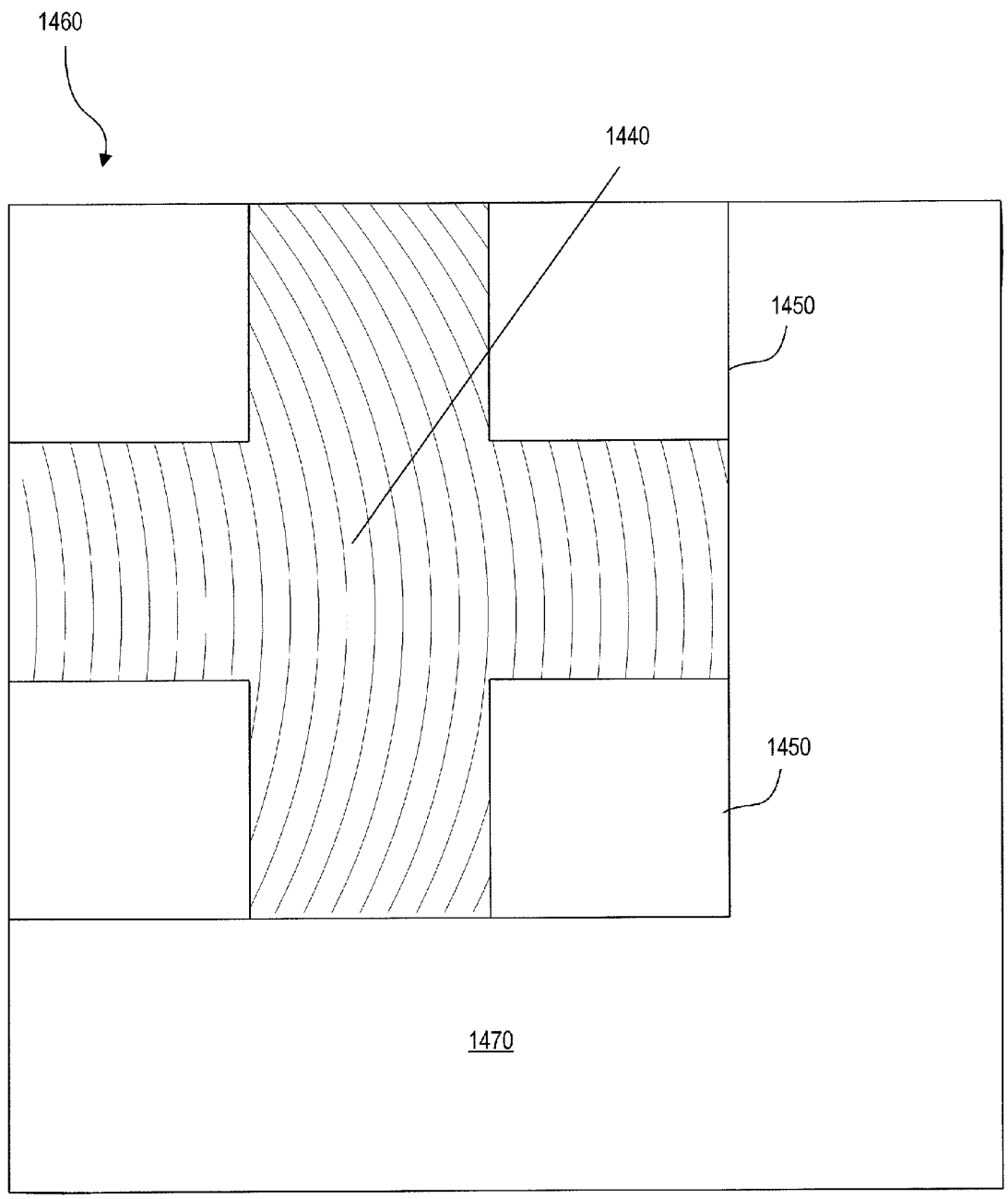
FIG. 14E is a planar view of a raised relief-type fiducial wherein the pedestal includes a diffraction grating, and wherein the grating is produced by a custom milling tool, according to an embodiment.

Gratings may be milled in parts of a fiducial that are relatively convenient for milling operations. For example, for a relief-type fiducial, a grating is milled on prominent features such as a surface comprising the top of a pedestal or a molded, raised shape that is a precursor of the relief-type fiducial. Lower portions of the relief-type fiducial are below the path of and do not touch the tool, and therefore no grating is formed on those lower surfaces. FIG. 14E shows a fiducial 1460 occupying a portion of an optical wafer such as a lens plate 1470. Fiducial 1460 includes a raised central surface, in this embodiment comprising a cross shaped pedestal 1440 surrounded by a lower surface in this embodiment comprising four sunken background areas 1450. Pedestal 1440 contains arcs or grooves on its raised surface that are produced by milling, such as with the tool of FIG. 14A. Since the rotating milling tool of FIG. 14A is better able to cut grooves into the raised surface than the lower surface, areas bearing the diffraction grating may be defined by an area of raised surface of the relief-type fiducial of FIG. 14E.

Figure 14F:
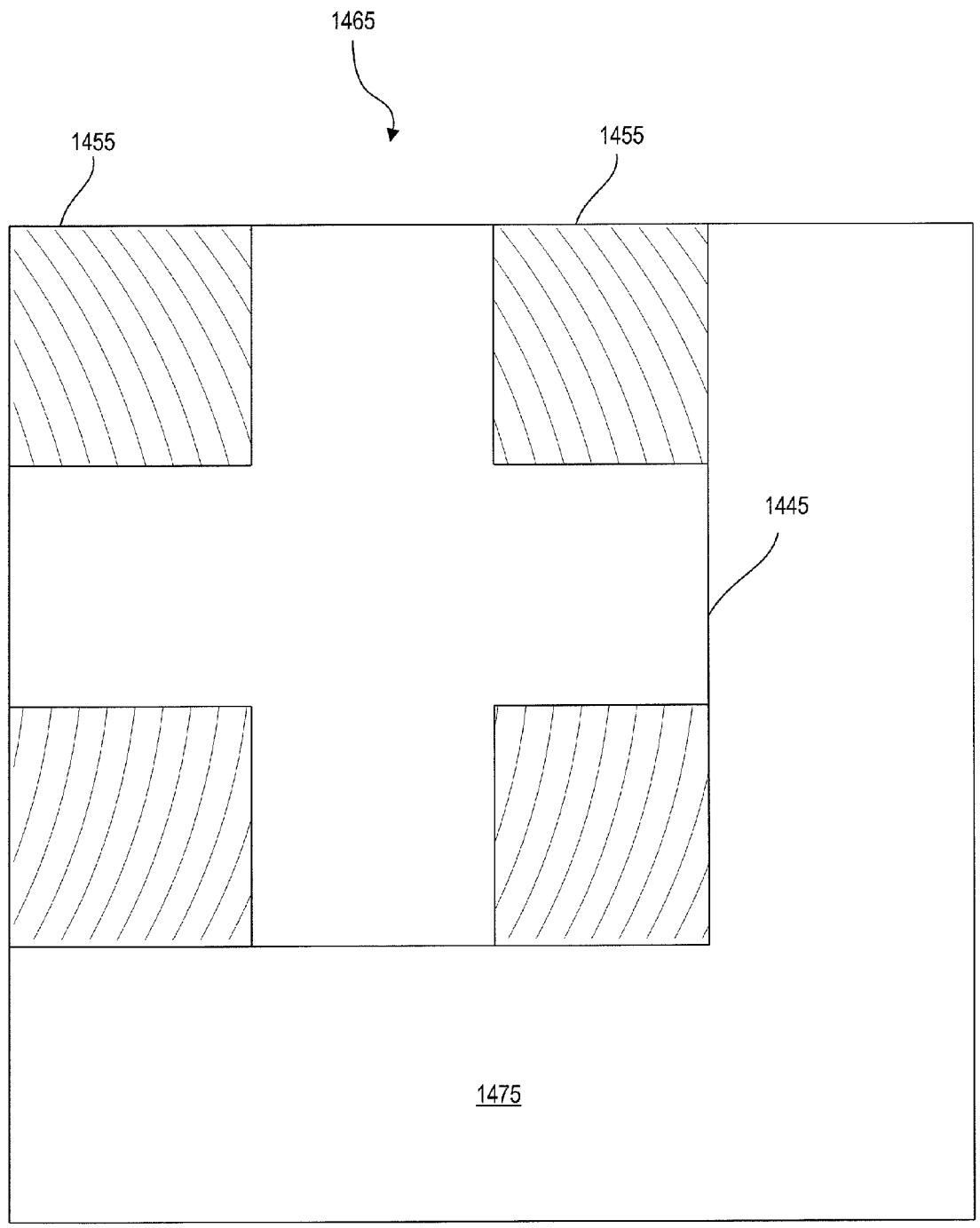
FIG. 14F is a planar view of a sunken relief-type fiducial wherein the surrounding pedestals include diffraction gratings, and wherein the gratings are produced by a custom milling tool, according to an embodiment.

FIG. 14F shows a second, complementary, fiducial 1465 that occupies a portion of a second optical wafer, such as lens plate 1475. Fiducial 1465 includes a central, cross shaped lower surface or sunken area 1445 surrounded by a raised surface comprising four pedestal areas 1455. Pedestal areas 1455 contain arcing grooves that are produced by milling. An example of a milled relief-type fiducial may be a relief-type fiducial that is a 0.35 millimeter by 0.35 millimeter square, with a sunken central area being a cross that is 0.06 millimeter wide, wherein this sunken area is surrounded by four 0.145 millimeter by 0.145 millimeter square shaped pedestals. The pedestals contain gratings having arcuate lines that are produced by a rotating milling tool operated with a 0.25 millimeter radius, such as with the tool of FIG. 14A. Since the rotating milling tool of FIG. 14A is better able to cut grooves into the raised surface than the lower surface, areas bearing the diffraction grating may be defined by an area of raised surface of the relief-type fiducial of FIG. 14F. Since the milling tool is a rotary tool, the resulting grooves are arcuate grooves.

In an alternative embodiment, instead of rotating the milling tool over the fiducial, the milling tool is held stationary and the master is rotated underneath the tool.

In both the fiducials of FIG. 14E and FIG. 14F, once the fiducial has been formed and a grating has been cut on that fiducial with the rotating milling tool, the fiducial may be replicated by molding for high volume production. References herein to a fiducial of FIG. 14E or FIG. 14F having a grating cut with a rotating milling tool refer to either a master fiducial cut with such a rotating milling tool, or a fiducial replicated directly or indirectly from such a master. First generation replica fiducials produced from a fiducial having a milled grating as above described will have a first surface bearing the grating depressed relative to the second surface lacking the grating, but these surfaces will be at different heights. Similarly, second generation replica relief-type fiducials produced from a similar fiducial will have the first surface bearing the grating raised relative to the second surface lacking the grating, and again the first surface will have a height different from that of the second surface.

The fiducial of FIG. 14E may form a portion of a first optical wafer having one or more lenses, spacers, baffles, diaphragms, or similar structure; its complementary fiducial of FIG. 14F may similarly be formed on a second optical wafer having one or more lenses, spacers, baffles, diaphragms, or similar structures. When the fiducial of one wafer and its complementary fiducial of another wafer are aligned, the lenses, spacers, diaphragms, or other structures of the wafers typically combine to form a complex optical structure such as a compound lens or lens with a spacer. The wafers may then be bonded together. Similarly, once the first and second optical wafers are aligned, a fiducial on either of the first and second optical wafers may be aligned to a complementary fiducial on a third optical wafer. By providing suitable fiducials and complementary fiducials, complex optical structures of any number of optical wafers may be formed. In particular, a complex optical structure may be formed having a simple or a compound lens with a diaphragm, a spacer for providing proper focal length when aligned to a photosensor array, and a baffle for excluding stray light.

A fiducial having a diffractive pattern similar to that of FIG. 14E or of FIG. 14F may also be formed directly on a surface of a photosensor array as etched metal lines or similar structures, or indirectly on a spacer aligned to the photosensor array. The fiducial of this photosensor array may be aligned to fiducials similar to those of FIG. 14E or FIG. 14F of additional optical wafers or to a fiducial of a previously assembled complex optical structure to form a complete camera or other electro-optical device.

In order to facilitate aligning wafers in rotation as well as translation, fiducials and their complementary fiducials, such as those discussed with reference to FIG. 14E and FIG. 14F, may be formed in two or more locations on each optical plate or wafer. If both fiducials are simultaneously aligned, alignment in rotation can be assured.

Grating productions by milling operations include several characteristics that are mentioned here. First, some spacing, or "air", may be reserved around a grated pedestal, depending on the diameter of the milling tool. For example, clearance of approximately 600 micrometers may be left around a grated pedestal, allowing the tool to cut only the surface intended to receive the grating. Second, the grated lines are arc-shaped; hence a specified grating pitch is relatively more accurate at the center of the tool path. Third, during milling operations, the tool path may be set so as to prevent grating lines from being substantially parallel to the fiducial edges. For example, the tool path may be set to be approximately 45 degrees off of the fiducial edges so that the resulting grating lines are not substantially parallel to the fiducial edges.

In an alternative embodiment, an optical wafer has multiple first lenses and a first relief-type fiducial having a diffraction grating on at least some shapes of the fiducial structure that are suitable for providing good contrast for alignment. The optical wafer is produced, together with its replica gratings, by using a mold for the lenses, for the diffraction grating and the fiducial to mold a deformable molding material. The optical wafer is aligned to a second optical wafer having second optical lenses, such that first and second optical lenses cooperate as lens elements of a compound lens structure. The second optical wafer has a second fiducial structure complementary to the first fiducial structure of the first optical wafer for alignment to the first fiducial structure. Once aligned, the first and second optical wafers are bonded and diced, the die being attached over photosensor arrays to serve as lenses of electronic cameras. In another alternative embodiment, the fiducial has no relief structure and the grating is formed on a flat plane.

Figure 15:
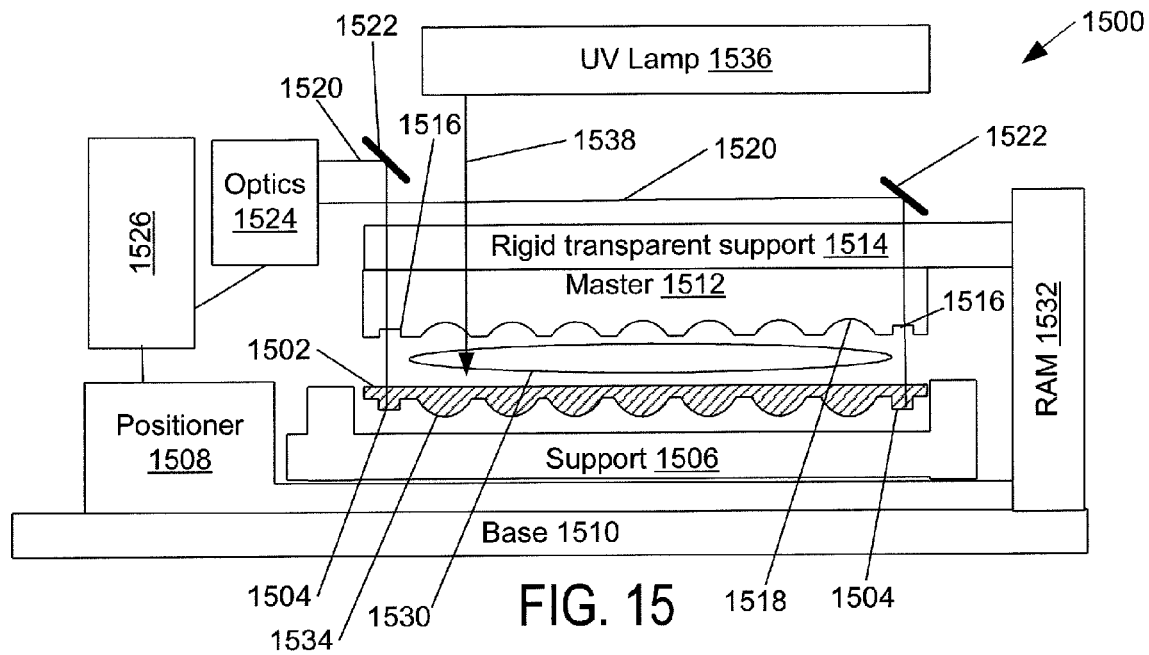
FIG. 15 illustrates aligning a master to a relief-type diffraction grating fiducial on an optical plate in an aligner for adding a back layer of structures to the optical plate.
Figure 18:
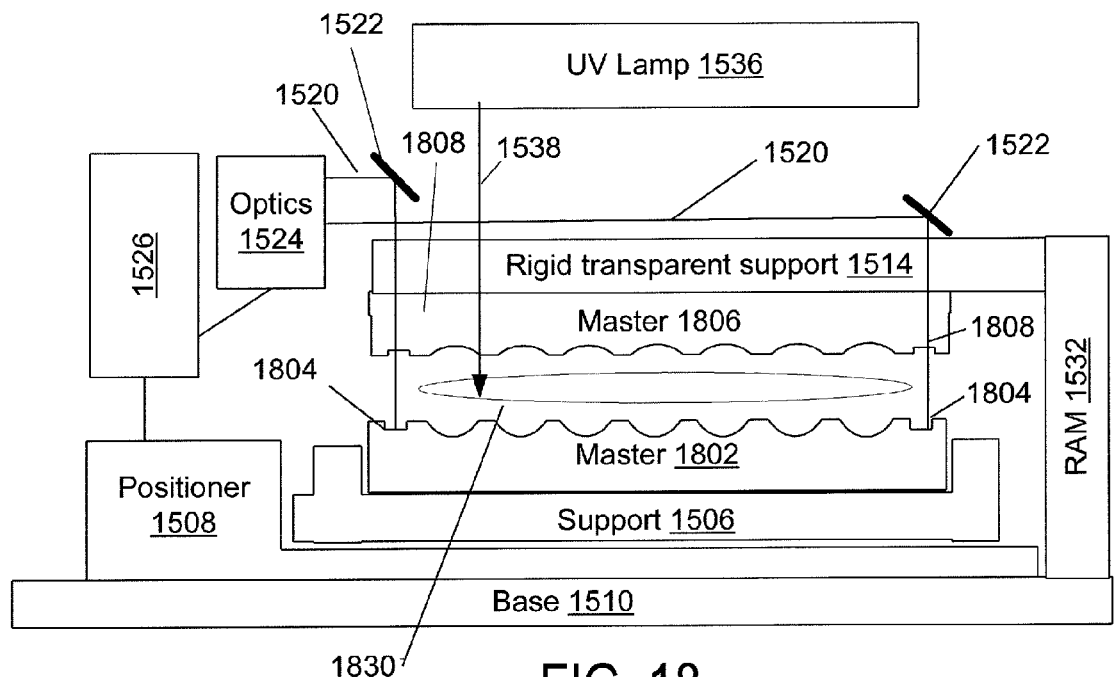
FIG. 18 illustrates aligning a first master to a second master for forming an optical plate having optical structures on a top and a bottom surface of the optical plate.

In addition to aligning optical wafers to each other, or to integrated circuitry, the relief-type diffraction grating fiducials herein described may be used both to align a master to a wafer for addition of layers of optical shapes to a wafer (as illustrated in FIG. 15, 16, 17), or for aligning a first master to a second master for forming an optical wafer having optical shapes on two sides (as illustrated in FIG. 18, 19).

Consider an optical wafer 1502 (FIG. 15) that has been formed with a flat side and a side having one or more optical shapes such as, but not limited to, lenses (shown), baffles, and spacers (not shown) for properly spacing the wafer 1502 from other wafers in a system; wafer 1502 having been formed from at least a first master (not shown). Wafer 1502 has formed thereon at least one, and preferably two or more, first fiducials 1504, which may be similar to fiducials 1460 and 1465, previously discussed with reference to FIG. 14E or 14F. Wafer 1502 is placed in an aligner 1500, and may be supported by an elastomeric surface or other supporting device in support 1506. Support 1506 is attached to positioner 1508. Positioner 1508 incorporates X and Y leadscrews and a rotating device (not shown) as known in the art of aligners, and may have motors or handwheels for operation as also known in the art of aligners. Positioner 1508 is attached to a base 1510.

A second master 1512 is attached to a supporting structure 1514, which in an embodiment is transparent. In an alternative embodiment, master 1512 is rigid and supporting structure 1514 is a frame attaching to edges of second master 1512. Second master 1512 has formed within it second fiducials 1516, which in an embodiment are complementary to first fiducials 1504 and positioned such that first fiducials 1504 and second fiducials 1516, when aligned, provide proper alignment between negative images 1518 of optical shapes desired to be formed on optical plate 1502. An optical pathway 1520, which may have one or more mirrors 1522, is provided to optics 1524, through which an observer or a microcomputer-based optoelectronic control system 1526 may view the fiducials and operate positioner 1508 to properly align second fiducials 1516 to first fiducials 1504, thereby indirectly aligning negative images 1518 of master 1512 to optical shapes, such as shapes 1534, on plate 1502.

A blob 1530 of an ultraviolet-curable polymeric optical material is prepositioned between second master 1512 and optical wafer 1502. Once master 1512 is aligned to wafer 1502, a ram 1532 is operated to press master 1512 into blob 1530 forming a back layer of shapes (not shown) on wafer 1502. An ultraviolet lamp 1536 is operated to provide ultraviolet light 1538 to at least partially cure those shapes, and ram 1532 is reversed to remove master 1512 from wafer 1502, releasing wafer 1502 with the additional shapes thereon. The resulting optical wafer therefore has multiple optical shapes, some on each side of the wafer, and comprises two or more layers of optical material. An additional layer may then be added to one or the other side of the resulting wafer as described with reference to FIG. 17; if this is done the resulting wafer may have three or more layers of optical material.

The final optical wafer is therefore made by aligning a second relief-type diffraction grating fiducial on a first master to a first relief-type diffraction grating fiducial on the optical wafer preform, pressing the first master into a blob to form optical shapes and adhere the blob to the wafer, and at least partially curing the blob before removing the master.

Figure 16:
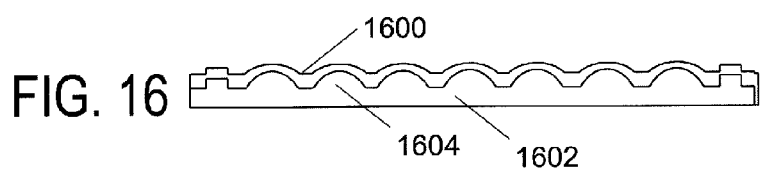
FIG. 16 illustrates an optical plate having two layers of optical structures on a face of the optical plate.

In an alternative embodiment, it may be desired to form a second layer 1600 of optical shapes on an optical wafer 1602 on top of a first layer of optical shapes 1604, as illustrated in FIG. 16. In an embodiment, the second layer may be formed from an ultraviolet-curable polymer having a different index of refraction than the first layer of optical shapes 1604; the resulting wafer forming an array of compound lenses. In an alternative embodiment, one of the first and second layers may be formed from a transparent material, and the other layer from an optically absorptive material, the resulting wafer forming an array of lenses in an opaque grid.

Figure 17:
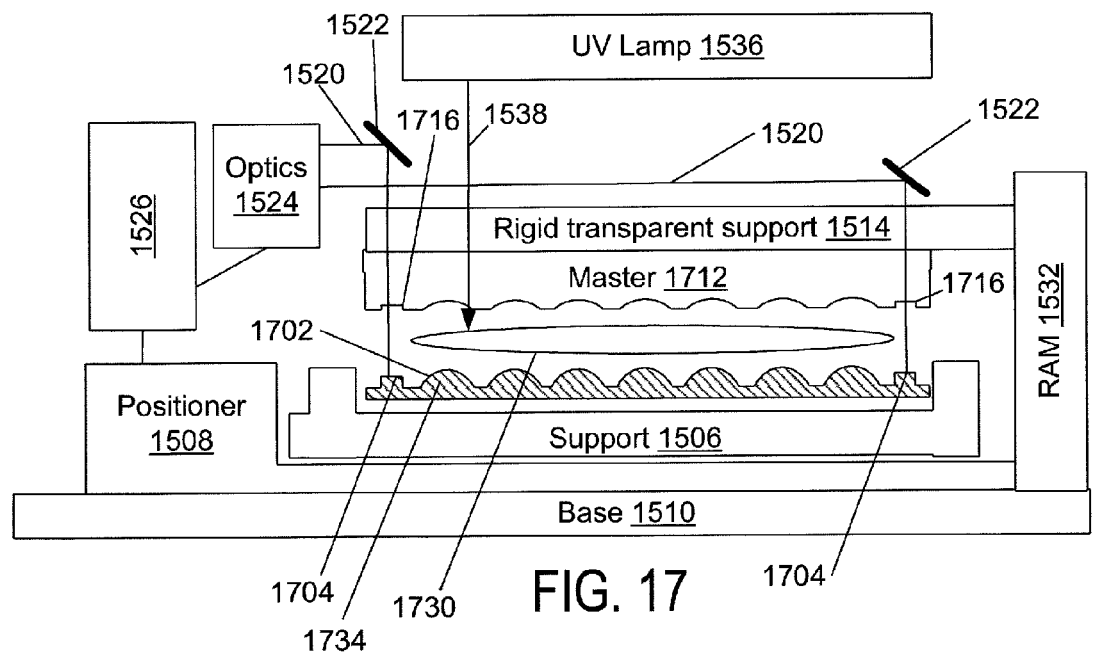
FIG. 17 illustrates aligning a master to a relief-type diffraction grating fiducial on an optical plate in an aligner for adding a second layer of optical structures on a face of the optical plate.

The embodiment of FIG. 16 is fabricated using an aligner similar to that illustrated in FIG. 17. Although exact shape of support 1506 of FIG. 17 may differ from that of support 1506 of FIG. 15, the functions of support 1506, positioner 1508, base 1510, support 1514, optical path 1520, mirrors 1522, optics 1524, controller 1526, ram 1532, UV lamp 1536 and light 1538 of FIG. 17 greatly resemble that of like-numbered components of FIG. 15 and they will not be separately described here.

In this embodiment, wafer 1702 is formed in a prior operation with two or more first fiducials 1704 and is placed in support 1506 with previously-formed optical shapes 1734 uppermost. Master 1712 is formed with two or more second fiducials 1716 which permit alignment to first fiducials 1704 and in an embodiment second fiducials 1716 are complementary to first fiducials 1704. The first fiducials 1704 are aligned to the second fiducials 1716 using optics 1524 and optical path 1520 while adjusting positioner 1508 as described with reference to the embodiment of FIG. 15. Ram 1532 then forces master 1712 into a prepositioned blob 1730 to form shapes in blob 1730, and UV light 1538 applied by lamp 1536 cures blob 1730, forming the additional layer of optical shapes.

The resulting wafer comprises two or more layers of optical material. In an embodiment, first fiducials 1704 are buried by the second layer formed from blob 1730, and in a particular case of that embodiment an additional fiducial is formed in that second layer as a replica of second fiducial 1716.

The final optical wafer is therefore made by aligning a second relief-type diffraction grating fiducial on a second master to a first relief-type diffraction grating fiducial on the optical wafer preform, pressing the second master into a blob to form optical shapes and adhere the blob to the wafer, and at least partially curing the blob before removing the master, with the second master on the same side of the wafer as the optical shapes and fiducial formed on the wafer by a first master.

Figure 19:
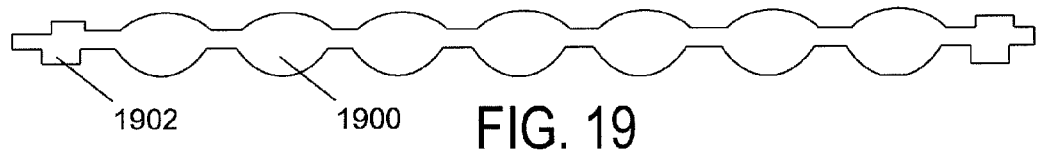
FIG. 19 illustrates an optical plate having optical structures on both top and bottom surface, such as may be made by the system of FIG. 18.

While an embodiment forms a wafer having upper and lower optical shapes from a first and second layer of optical material by forming wafer 1502 in a first molding operation and applying and forming a second layer of optical material in the second operation discussed with reference to FIG. 15, the relief-type diffraction grating fiducials may be used to form a wafer with aligned upper and lower optical shapes in one operation as discussed with reference to FIGS. 18 and 19.

Although exact shape of support 1506 of FIG. 18 may differ from that of support 1506 of FIG. 15, the functions of support 1506, positioner 1508, base 1510, support 1514, optical path 1520, mirrors 1522, optics 1524, controller 1526, ram 1532, UV lamp 1536 and light 1538 of FIG. 17 greatly resembles those of like-numbered components of FIG. 15 and they will not be separately described here.

In the embodiment of FIG. 18, a first master 1802 is provided having two or more first relief-type fiducials 1804. A second master 1806 having two or more second relief-type fiducials 1808 is also provided, where the second relief-type fiducials 1808 are in a particular embodiment complementary to first fiducials 1804.

First fiducials 1804 are aligned to second fiducials 1808 by using the optical paths 1520, mirrors 1522, optics 1524, controller 1526, and positioner 1508 as heretofore described. Ram 1532 then presses second master 1806 into a prepositioned blob 1830 of ultraviolet-curable polymeric material and into cavities of first master 1802, and light 1538 from UV lamp 1536 cures the polymeric material resulting in a molded wafer 1900 as illustrated in FIG. 19.

In embodiments, molded wafer 1900 has molded mirror images 1902 (one shown) of first fiducials 1804. Fiducial 1902, fiducial 1704 or fiducial 1504 may serve as replica diffraction grating relief-type fiducials in aligning wafers 1900, 1702, 1502, 1602 to masters in further molding steps as illustrated in FIGS. 15 and 17, or to other wafers or to an image-sensor integrated circuit as previously described.

The final optical wafer is therefore made by aligning a second relief-type diffraction grating fiducial on a second master to a first relief-type diffraction grating fiducial on a first master, pressing the first and second masters into a blob to form optical shapes, and at least partially curing the blob before removing the masters.

Various features of the foregoing embodiments may be combined. A few such examples are illustrated below.

(a) A method of aligning a first optical plate with a second optical device (the second optical device being an optical plate, an image sensor or a master) involves providing first fiducials in at least two locations on the first optical plate, each first fiducial having at least a first diffraction grating. At least two second fiducials are provided in at least two locations on the second optical device, each second fiducial having a second diffraction grating with the first fiducials complementary to the second fiducials. The first optical plate is positioned over the second optical device and the first fiducial is aligned to the second fiducial at the at least two locations on each. In a particular embodiment the first optical plate has an array of lenses.

(b) In an alternative embodiment of the method of (a) the first and second fiducials are relief-type fiducials and at least one of the first and second diffraction gratings is a milled grating having arcuate lines.

(c) In another embodiment of the method denoted by (a) or (b), the second optical device is a master, and the method further includes inserting a curable polymeric material between the first optical plate and the second optical device, molding the curable polymeric material, at least partially curing the curable polymeric material, and removing the second optical device, and cutting the first optical plate into individual optical assemblies.

(d) In another embodiment, the method denoted by (a) or (b) continues with bonding the first optical plate and the second optical device after the step of aligning, and cutting the bonded optical plate and device into individual optical assemblies.

(e) In another embodiment, the method denoted by (c) or (d) continues with providing a photosensor array having a third fiducial formed in metal thereon, and aligning the third fiducial to a fourth relief-type fiducial on an individual optical assembly having at least a third diffraction grating and complementary to the third fiducial.

(f) In another embodiment of the method denoted by (a), (b), (d) or (e), at least one diffraction grating of at least one fiducial is a milled grating having a blazing angle between 20 and 45 degrees.

(g) In another embodiment, the blazing angle of the method denoted by (f) is approximately 30 degrees.

(h) In an embodiment of the wafer level optical packaging system there is at least one first plate, the plate having at least one first relief-type fiducial and at least one lens, the fiducial having a first and a second surface, the first surface having a height different from the second surface. The first surface includes a first diffraction grating, the second surface lacks a diffraction grating. There is also a second fiducial on a second plate having a second optical component, the second fiducial complementary to the first fiducial and positioned to permit use of the first and second fiducials to align the first plate with the second plate. The second fiducial has a second diffraction grating.

(i) In an embodiment of the system denoted by (h) the first diffraction grating is a milled grating having arcuate lines.

(j) In an embodiment of the system denoted by (h) or (i) the second plate has a lens.

(k) In an embodiment of the system denoted by (h) or (i), the second device is an image sensor and the second fiducial is a diffraction grating formed from parallel metal line segments on the image sensor.

(l) In an embodiment of the system denoted by any of (a) through (k) there is a third plate having a third optical component and a third fiducial, the first plate further comprising a fourth fiducial complementary to the third fiducial.

(m) In an embodiment of the system denoted by (h), (i) (k) or (l) the first diffraction grating is a transmission grating.

(n) In an embodiment of the system denoted by (h), (i) (k) or (l) the first diffraction grating is a reflection-type grating.

(o) In an embodiment of the system denoted by any of (a) through (n), the first plate further comprises at least two layers of optical material.

(p) In an embodiment of the system denoted by (o) the first plate further comprises at least one buried fiducial.

(q) In an alternative method of forming an optical wafer, the wafer is formed by aligning a second relief-type diffraction grating fiducial on a second master to a first relief-type diffraction grating fiducial on a first master; pressing the first master into a blob of curable polymeric optical material between the aligned first and second masters to shape the blob, and at least partially curing the blob to form the optical wafer.

(r) In an embodiment method denoted by (q), the second relief-type diffraction grating fiducial is a component of an optical wafer preform.

(s) In an embodiment of the method denoted by (q) the second relief-type diffraction grating fiducial is a component of a second master, and the step of pressing the first master into the blob further comprises pressing the blob against the second master.

(t) A second alternative method of forming an optical wafer includes aligning a second relief-type diffraction grating fiducial on a second master to a first relief-type diffraction grating fiducial on an optical plate formed from a first master; pressing the second master into a blob of curable polymeric optical material between the aligned optical plate and the second master to shape the blob, and at least partially curing the blob to form the optical wafer.

It should be noted that the first optical plate or the second optical device of the method of aligning herein described and denoted by (a) may be performed with optical wafers or plates formed by the methods of forming an optical wafer denoted by (q) or (t).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A wafer level optical packaging system comprising at least one first plate, the plate further comprising at least one first relief-type fiducial and at least one lens, the fiducial having a first and a second surface, the first surface having a height different from the second surface, wherein at least a portion of the first surface includes a first diffraction grating, and at least a portion of the second surface has no diffraction grating;
   a second fiducial on a second device having a second optical component, the second fiducial complementary to the first fiducial and positioned to permit use of the first and second fiducials to align the first plate with the second plate, the second fiducial further comprising a second diffraction grating;
   wherein the first diffraction grating includes a milled grating having arcuate lines.

2. The wafer level packaging system of claim 1 wherein the second device comprises an image sensor and wherein the second fiducial comprises a diffraction grating formed from parallel metal line segments on the image sensor.

3. The wafer level packaging system of claim 2 further comprising a third plate comprising a third optical component and a third fiducial, the first plate further comprising a fourth fiducial complementary to the third fiducial.

4. The wafer level packaging system of claim 1 wherein the second device is a plate comprisings a lens.

5. The wafer level packaging system of claim 1 wherein the diffraction grating is a transmission grating.

6. The wafer level packaging system of claim 1 wherein the diffraction grating is a reflection-type grating.

7. A wafer level optical packaging system comprising at least one first plate, the plate further comprising at least one first relief-type fiducial and at least one lens, the fiducial having a first and a second surface, the first surface having a height different from the second surface, wherein at least a portion of the first surface includes a first diffraction grating, and at least a portion of the second surface has no diffraction grating;
   a second fiducial on a second device having a second optical component, the second fiducial complementary to the first fiducial and positioned to permit use of the first and second fiducials to align the first plate with the second plate, the second fiducial further comprising a second diffrfaction grating;
   wherein the first plate further comprises at least two layers of optical material.

8. The wafer level optical packaging system of claim 7, wherein the first plate further comprises at least one buried fiducial.

* * * * *

UNITED STATES PATENT AND TRADEMARK OFFICE
CERTIFICATE OF CORRECTION

PATENT NO. : 9,035,406 B2  
APPLICATION NO. : 13/113857  
DATED : May 19, 2015  
INVENTOR(S) : Rauker et al.

Page 1 of 1

It is certified that error appears in the above-identified patent and that said Letters Patent is hereby corrected as shown below:

In the specification

Column 6, line 19, "acrylate photopolymer" should read --acrylate photopolymer film--;

Signed and Sealed this
Fifteenth Day of December, 2015

Michelle K. Lee
*Director of the United States Patent and Trademark Office*